(12) United States Patent
Kaneko et al.

(10) Patent No.: US 7,324,573 B2
(45) Date of Patent: Jan. 29, 2008

(54) METHOD OF FABRICATING SURFACE-EMISSION TYPE LIGHT-EMITTING DEVICE, SURFACE-EMITTING SEMICONDUCTOR LASER, METHOD OF FABRICATING THE SAME, OPTICAL MODULE AND OPTICAL TRANSMISSION DEVICE

(75) Inventors: Tsuyoshi Kaneko, Nagano-ken (JP); Takayuki Kondo, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 82 days.

(21) Appl. No.: 11/100,471

(22) Filed: Apr. 7, 2005

(65) Prior Publication Data

US 2005/0199896 A1    Sep. 15, 2005

Related U.S. Application Data

(62) Division of application No. 10/092,777, filed on Mar. 8, 2002, now Pat. No. 6,900,069.

(30) Foreign Application Priority Data

| Mar. 9, 2001 | (JP) | ............................. 2001-066299 |
| Mar. 13, 2001 | (JP) | ............................. 2001-070726 |
| Mar. 6, 2002 | (JP) | ............................. 2002-060316 |
| Mar. 6, 2002 | (JP) | ............................. 2002-060751 |

(51) Int. Cl.
*H01S 5/028* (2006.01)
*H01S 5/323* (2006.01)

(52) U.S. Cl. .................................................. 372/49.01

(58) Field of Classification Search ............. 372/49.01, 372/34, 92, 98
See application file for complete search history.

(56) References Cited

U.S. PATENT DOCUMENTS

| 5,093,225 A | 3/1992 | Holmstrom et al. |
| 5,208,183 A | 5/1993 | Chen et al. |
| 5,229,257 A | 7/1993 | Cronin et al. |

(Continued)

FOREIGN PATENT DOCUMENTS

JP    A-11-168263    6/1999

(Continued)

OTHER PUBLICATIONS

Technical Report of IEICE, LQE98-141, Feb. 1999, Institute of Electronics, Information and Communication Engineers.

*Primary Examiner*—M. Wilczewski
(74) *Attorney, Agent, or Firm*—Oliff & Berridge, PLC

(57) ABSTRACT

A method of fabricating a surface-emission type light-emitting device which emits light in a direction perpendicular to a semiconductor substrate, includes the following steps (a) to (e). (a) A step of forming a column-shaped section by etching at least a part of a multilayer film. (b) A step of forming a first resin layer so as to cover the column-shaped section. (c) A step of forming a second resin layer by changing the solubility of the first resin layer in a liquid. (d) A step of immersing, for a specific period of time, at least the column-shaped section and the second resin layer in a liquid in which the second resin layer dissolves, thereby removing the second resin layer at least in the area formed over the column-shaped section. (e) A step of forming an insulating layer by curing the second resin layer.

9 Claims, 21 Drawing Sheets

U.S. PATENT DOCUMENTS

| | | |
|---|---|---|
| 5,508,803 A | 4/1996 | Hibbs et al. |
| 5,513,199 A | 4/1996 | Haase et al. |
| 5,587,335 A * | 12/1996 | Mori et al. .................... 438/29 |
| 5,658,823 A | 8/1997 | Yang |
| 6,088,378 A | 7/2000 | Furukawa |
| 6,160,081 A | 12/2000 | Tanaka et al. |
| 6,507,594 B1 * | 1/2003 | Furukawa et al. ............ 372/36 |
| 6,521,476 B2 | 2/2003 | Kubota |
| 6,597,720 B2 * | 7/2003 | Kondo ......................... 372/96 |
| 6,656,759 B1 | 12/2003 | Nakanishi et al. |
| 6,751,242 B2 * | 6/2004 | Kaneko et al. .......... 372/43.01 |
| 6,771,677 B2 | 8/2004 | Furukawa et al. |

FOREIGN PATENT DOCUMENTS

| | | |
|---|---|---|
| JP | A-2000-101185 | 4/2000 |

* cited by examiner

METHOD OF FABRICATING SURFACE-EMISSION TYPE LIGHT-EMITTING DEVICE, SURFACE-EMITTING SEMICONDUCTOR LASER, METHOD OF FABRICATING THE SAME, OPTICAL MODULE AND OPTICAL TRANSMISSION DEVICE

This is a Division of application Ser. No. 10/092,777 filed Mar. 8, 2002 now U.S. Pat. No. 6,900,069. Japanese Patent Application No. 2001-66299, filed on Mar. 9, 2001, Japanese Patent Application No. 2001-70726, filed on Mar. 13, 2001, Japanese Patent Application No. 2002-60316, filed on Mar. 6, 2002 and Japanese Patent Application No. 2002-60751, filed on Mar. 6, 2002, are hereby incorporated by reference in their entirety.

BACKGROUND OF THE INVENTION

The present invention relates to a method of fabricating a surface-emission type light-emitting device which emits light in a direction perpendicular to a substrate. The present invention also relates to a surface-emitting semiconductor laser fabricated by the above fabrication method which has stable characteristics during driving, and a method of fabricating the same. Furthermore, the present invention relates to an optical module and an optical transmission device using the surface-emitting semiconductor laser.

A surface-emission type light-emitting device represented by a surface-emitting semiconductor laser is a two-dimensionally integratable light-emitting device. Therefore, application of the surface-emission type light-emitting device to a wide range of fields such as a light source for high-speed, large-capacity optical communications has been expected.

Parasitic capacitance of the device causes a problem when driving a light-emitting device at a high speed. In the case of a surface-emitting semiconductor laser, current must be injected into an active layer from the surface of a substrate in order to drive the device. In order to prevent current from being injected into the active layer from sections other than a light-emitting section (section contributing to emission of light), an insulating layer is generally formed in a region other than near the light-emitting section. An electrode is formed on the surface of the substrate through the insulating layer. Therefore, a layer structure consisting of the electrode, insulating layer, and semiconductor is formed in the device. This layer structure causes parasitic capacitance to occur.

This parasitic capacitance is decreased by increasing the thickness of the insulating layer. Therefore, a method of filling the periphery of the light-emitting section with an insulating resin represented by a polyimide and using the resin as the insulating layer has been employed. A surface-emitting semiconductor laser having such a structure is disclosed in "Technical Report of IEICE", LQE98-141, 1999-2 published by the Institute of Electronics, Information and Communication Engineers.

An example of a common surface-emitting semiconductor laser in which the periphery of the light-emitting section is filled with a resin and a method of fabricating the same is shown in FIGS. 17 to 19. In a surface-emitting semiconductor laser 500 shown in FIG. 17, an active layer 105 is formed in a column-shaped section 110 and light is emitted from a light exit port 116 on the upper surface of the column-shaped section 110. In order to drive the surface-emitting semiconductor laser 500, an electrode 113 for injecting current into the active layer 105 must be formed over the column-shaped section 110, as shown in FIG. 17. The periphery of the column-shaped section 110 may be filled with an insulating resin layer 517 in order to decrease the parasitic capacitance of the device, as shown in FIG. 17. When forming the surface-emitting semiconductor laser 500 shown in FIG. 17, after filling the periphery of the column-shaped section 110 with a resin layer 517a, the resin layer 517a is removed in the area formed over the column-shaped section 110, and an upper electrode 113 must be formed so as to be connected to the upper surface of the column-shaped section 110. Therefore, after filling the periphery of the column-shaped section 110 with the resin layer 517a, a device 500a is installed in a polishing machine 550 and the resin 517a is polished using abrasives 551 using a CMP process or the like before forming the upper electrode 113, as shown in FIG. 19, whereby the resin layer 517a is removed in the area formed over the column-shaped section 110.

However, the method shown in FIG. 19 may cause the column-shaped section 110 to be polished at the same time as the resin layer 517a. In this case, the device may be damaged or characteristics of the device may deteriorate. Moreover, the resin or abrasive removed by polishing may adhere to the device, thereby causing characteristics of the device to deteriorate. Therefore, it is difficult to obtain a device having stable characteristics unless the electrode 113 is formed after cleaning the upper surface of the column-shaped section 110 using a thorough cleaning step and dry etching step in combination in addition to the polishing step. The addition of the cleaning step increases the number of steps, thereby increasing the fabrication cost.

BRIEF SUMMARY OF THE INVENTION

The present invention may provide a method of fabricating a surface-emission type light-emitting device capable of producing a device having stable characteristics at a lower cost and at high yields.

The present invention may also provide a surface-emitting semiconductor laser fabricated by the method of fabricating a surface-emission type light-emitting device which has stable device characteristics during driving, and a method of fabricating the same.

Further, the present invention may provide an optical module and an optical transmission device using the surface-emitting semiconductor laser.

Method of Fabricating Surface-Emission Type Light-Emitting Device (1) According to the first aspect of the present invention, there is provided a method of fabricating a surface-emission type light-emitting device including a column-shaped section formed on a substrate which functions as at least a part of a light-emitting device, which emits light in a direction perpendicular to the substrate, comprising the following steps (a) to (e):

(a) a step of forming a multilayer film including an active layer on the substrate, and etching at least a part of the multilayer film so as to form the column-shaped section, (b) a step of forming a first resin layer so as to cover the column-shaped section, (c) a step of forming a second resin layer by changing a solubility of the first resin layer in a specific liquid, (d) a step of immersing, for a specific period of time, at least the second resin layer in the specific liquid having characteristics which cause the second resin layer to dissolve, so as to remove the second resin layer at least in the area formed over the column-shaped section, and (e) a step of forming an insulating layer which covers a side surface of the column-shaped section by curing the second resin layer.

According to this aspect, only the second resin layer can be removed without causing damage to the column-shaped section in the step (d) by immersing at least the second resin layer in the liquid for a specific period of time and removing the second resin layer in the area formed over the column-shaped section. This enables a device having stable characteristics to be obtained. Moreover, the device can be fabricated at a lower cost and at high yields.

In this case, the step (c) may change the solubility of the first resin layer in the specific liquid by applying one of heat and light to the first resin layer. This enables the second resin layer to be formed by easily changing the solubility of the first resin layer in the specific liquid by applying either heat or light to the first resin layer, thereby the second resin layer can be removed efficiently in the area formed over the column-shaped section.

(2) According to the second aspect of the present invention, there is provided a method of fabricating a surface-emission type light-emitting device including a column-shaped section formed on a substrate which functions as at least a part of a light-emitting device, which emits light in a direction perpendicular to the substrate, comprising the following steps (a) to (e):

(a) a step of forming a multilayer film including an active layer on the substrate, and etching at least a part of the multilayer film so as to form the column-shaped section, (b) a step of forming a first resin layer including a resin precursor so as to cover the column-shaped section, (c) a step of forming a second resin layer by semi-curing the first resin layer, (d) a step of immersing, for a specific period of time, at least the second resin layer in a liquid in which the second resin layer dissolves, so as to remove the second resin layer at least in the area formed over the column-shaped section, and (e) a step of forming an insulating layer which covers a side surface of the column-shaped section by curing the second resin layer.

"Semi-curing" in the step (c) means changing solubility of the first resin layer in the liquid used in the step (d). By the semi-curing, the first resin layer converts to the second resin layer. In other words, solubility in the liquid used in the step (d) differs between the first and the second resin layers.

According to this aspect, effects and advantages the same as those obtained by the fabrication method described in the above (1) can be achieved. For example, in the case of forming the second resin layer having a lower solubility in the liquid than the first resin layer by semi-curing the first resin layer in the step (c), since the dissolving speed of the second resin layer in the liquid can be decreased by this semi-curing step, a margin during the removal step of the second resin layer in the liquid can be increased.

(3) According to the third aspect of the present invention, there is provided a method of fabricating a surface-emission type light-emitting device including a column-shaped section formed on a substrate which functions as at least a part of a light-emitting device, which emits light in a direction perpendicular to the substrate, comprising the following steps (a) to (e):

(a) a step of forming a multilayer film including an active layer on the substrate, and etching at least a part of the multilayer film so as to form the column-shaped section, (b) a step of forming a first resin layer including a resin precursor and a photosensitive component so as to cover the column-shaped section, (c) a step of converting a part of the first resin layer into a second resin layer by exposing the first resin layer for a specific period of time, (d) a step of immersing, for a specific period of time, at least the second resin layer in a liquid in which the second resin layer dissolves, so as to remove the second resin layer, and (e) a step of forming an insulating layer which covers a side surface of the column-shaped section by curing the first resin layer.

According to this aspect, effects and advantages the same as those obtained by the fabrication method described in the above (1) can be achieved. In the step (c), a part of the first resin layer is converted into the second resin layer having a higher solubility in the liquid than the first resin layer by exposing the first resin layer, for example. Since the dissolving speed of the second resin layer in the liquid can be increased by this exposure step, only the second resin layer can be removed efficiently.

Moreover, since the liquid has characteristics which cause the second resin layer to dissolve, components of the second resin layer can be prevented from readhering to the column-shaped section.

In this case, the photosensitive component may have characteristics which changes solubility in the liquid by light irradiation.

The methods of fabricating a surface-emission type light-emitting device described in the above (1) to (3) may have any of the following features (4) to (10).

(4) The liquid may have characteristics which removes the second resin layer. This means that the liquid gets into the joint section between the second resin layer and the column-shaped section during the process in which the second resin layer dissolves in the liquid, thereby the second resin layer is removed. With this characteristics, the second resin layer can be removed efficiently in the area formed over the column-shaped section.

(5) The column-shaped section may have a lower solubility in the liquid than the second resin layer. With this configuration, a sufficient margin can be produced relating to the period of time in which the column-shaped section and the second resin layer are immersed in the liquid, so that stable fabrication can be performed. Also, since the column-shaped section can be prevented from dissolving in the liquid before the second resin layer, effects on the characteristics of the device can be limited.

(6) The resin precursor may be a polyimide resin precursor.

(7) The insulating layer may be formed of a polyimide resin.

(8) The liquid may be an alkaline solution. The alkaline solution used herein is a common basic solution.

(9) The method may further comprise a step of forming a monitoring section which monitors the removal of the second resin layer near the column-shaped section. With this configuration, whether or not the second resin layer is removed in the area formed over the column-shaped section can be detected precisely. As a result, the second resin layer can be removed in the area formed over the column-shaped section without causing damage to the column-shaped section.

In this case, the monitoring section may be formed in the same patterning step as the column-shaped section in the step (a).

(10) The surface-emission type light-emitting device may be any of a surface-emitting semiconductor laser, an LED device, and a semiconductor light amplification device.

In the case where the surface-emission type light-emitting device is a surface-emitting semiconductor laser, the column-shaped section may comprise an active layer, and the surface-emission type light-emitting device may comprise a resonator formed of a semiconductor deposition including the column-shaped section at least in part.

In this case, the method may further comprise the following step (f).

(f) A step of forming electrodes which inject current into the active layer.

In this case, the method may further comprise a step of cleaning the upper surface of the column-shaped section before the step (f). By this step, a device having more stable characteristics can be obtained.

Surface-Emitting Semiconductor Laser and Method of Fabricating the Same Surface-Emitting Semiconductor Laser According to the fourth aspect of the present invention, there is provided a surface-emitting semiconductor laser including a resonator formed on a semiconductor substrate, which emits light in a direction perpendicular to the semiconductor substrate, comprising:

a column-shaped section which forms at least a part of the resonator, and an insulating layer which covers a side surface of the column-shaped section, wherein the insulating layer comprises a filler.

The direction perpendicular to the semiconductor substrate is the direction perpendicular to the surface of the semiconductor substrate on which the resonator is formed.

According to this aspect, since the insulating layer comprises a filler, characteristics of the insulating layer such as thermal conductivity and a coefficient of thermal expansion can be adjusted. As a result, excellent device characteristics can be obtained. The details are described in "DETAILED DESCRIPTION OF THE EMBODIMENT."

The surface-emitting semiconductor laser of this aspect may have any of the following features (1) to (7).

(1) The filler may be formed of a material having thermal conductivity higher than that of a matrix material which forms the insulating layer. With this configuration, heat generated from the resonator when driving the surface-emitting laser moves to the insulating layer so as to be diffused quickly through the filler included in the insulating layer. Thus, a rise in temperature of the resonator can be decreased. As a result, a decrease in characteristics of the device due to heat can be prevented, thereby the stable device characteristics can be maintained.

(2) The filler may be formed of a material having a coefficient of thermal expansion different from that of a matrix material which makes up the insulating layer. According to this feature, the filler included in the insulating layer adjust the difference in coefficient of thermal expansion between the semiconductor substrate and the insulating layer, thereby a strain between the semiconductor substrate and the insulating layer can be reduced. Specifically, the difference in coefficient of thermal expansion between the semiconductor substrate and the matrix material which makes up the insulating layer can be decreased by using the filler having a specific coefficient of thermal expansion corresponding to the difference in coefficient of thermal expansion between the semiconductor substrate and the insulating layer. As a result, a strain between the semiconductor substrate and the insulating layer can be reduced and, therefore, reliability of the device can be maintained.

(3) The insulating layer may be formed of a matrix material such as a polyimide resin. In the fabrication of the surface-emitting laser, after forming the insulating layer which covers a side surface of the column-shaped section, an annealing is performed when forming a pair of electrodes on the upper surface of the column-shaped section and the back surface of the semiconductor substrate (a surface of the semiconductor substrate opposite to the surface on which the resonator is formed). Therefore, it is necessary to form the insulating layer using a resin which can withstand the annealing step. Also, it is necessary to form the insulating layer using a resin which enables the insulating layer to be formed flat. In order to satisfy these requirements, the insulating layer may be formed using a polyimide resin as a matrix material. The polyimide resin is excellent in heat resistance and operationality.

(4) The particle diameter of the filler may be smaller than the thickness of the insulating layer. This enables the entire area of the filler to be covered with the insulating layer.

(5) The filler may be formed of an insulating material. This enables the electrodes formed around the resonator to be insulated reliably. As examples of the insulating material, aluminum nitride, aluminum oxide, silicon nitride, silicon oxide, and the like can be given. The filler formed of at least one of the above materials as an essential element may be used.

In this case, the filler may be formed of diamond and aluminum nitride because of its excellent thermal conductivity and insulation properties.

(6) The filler may be formed using at least one of carbon allotropes such as carbon and graphite, or aluminum, gold, silver, copper, tin, magnesium, nickel, and zinc as an essential component. Since these materials have high thermal conductivity, heat generated from the resonator can be quickly diffused to the outside of the device through the filler by using at least one of these materials as an essential component of the filler. In this manner, the characteristics of the device can be stabilized.

(7) The filler may be formed of a metal particle having an insulating film on a surface. This enables insulation properties of the filler to be increased.

The surface-emitting semiconductor laser of this aspect may be applied to an optical module. In this case, the optical module comprises the above described surface-emitting semiconductor laser and an optical waveguide. This optical module may be applied to an optical transmission device.

Method of Fabricating Surface-Emitting Semiconductor Laser (1) According to the fifth aspect of the present invention, there is provided a method of fabricating a surface-emitting semiconductor laser including a resonator formed on a semiconductor substrate, which emits light in a direction perpendicular to the semiconductor substrate, comprising the following steps (a) and (b):

(a) a step of forming a multilayer film on the semiconductor substrate, and etching at least a part of the multilayer film so as to form a column-shaped section including at least an active layer, and (b) a step of forming an insulating layer which comprises a filler and covers a side surface of the column-shaped section.

According to this aspect, a surface-emitting semiconductor laser having stable characteristics can be obtained.

(2) According to the sixth aspect of the present invention, there is provided a method of fabricating a surface-emitting semiconductor laser including a resonator formed on a semiconductor substrate, which emits light in a direction perpendicular to the semiconductor substrate, comprising the following steps (a) to (e):

(a) a step of forming a multilayer film on the semiconductor substrate, and etching at least a part of the multilayer film so as to form a column-shaped section including at least an active layer, (b) a step of forming a first matrix applying layer including a filler and a matrix precursor so as to cover the column-shaped section, (c) a step of forming a second matrix applying layer including the filler and a provisional matrix material by temporarily solidifying the matrix precursor which forms the first matrix applying layer, (d) a step of immersing, for a specific period of time, at least the second matrix applying layer in a liquid in which the provisional matrix material forming the second matrix applying layer dissolves, so as to remove the second matrix applying layer at least in the area formed over the column-shaped section, and (e) a step of forming an insulating layer which comprises the filler and covers a side surface of the column-shaped section by temporarily curing the provisional matrix material which forms the second matrix applying layer.

In the case of temporarily solidifying the matrix precursor in the step (c), the matrix precursor which forms the first matrix applying layer is converted into a provisional matrix material by irradiating the matrix precursor with energy such as heat or light, for example. In this case, the provisional matrix material obtained by the temporal solidification has solubility in the liquid used in the step (d) different from that of the matrix precursor.

According to this aspect, only the second matrix applying layer can be removed without causing damage to the column-shaped section in the step (d) by immersing at least the second matrix applying layer in the liquid for a specific period of time and removing the second matrix applying layer in the area formed over the column-shaped section. This enables a device having stable characteristics to be obtained. Moreover, the device can be fabricated at a lower cost and at high yields.

The filler in an upper part of the second matrix applying layer are automatically removed from the second matrix applying layer as the upper part of the second matrix applying layer is removed. This enables the insulating layer including the filler to be formed at a uniform thickness by a step almost the same as a commonly used step for burying an insulating layer.

Moreover, since the liquid has characteristics in which the provisional matrix material which forms the second matrix applying layer dissolves, the removed provisional matrix material can be prevented from readhering to the column-shaped section.

In the methods of fabricating a surface-emitting semiconductor laser described in the above (1) and (2), the insulating layer may be formed of a matrix material such as a polyimide resin.

The method of fabricating a surface-emitting semiconductor laser described in the above (2) may have any of the following features (3) to (5).

(3) The column-shaped section may have a lower solubility in the liquid than the provisional matrix material which forms the second matrix applying layer. With this configuration, a sufficient margin can be produced relating to the period of time in which the column-shaped section and the second matrix applying layer are immersed in the liquid, so that stable fabrication can be performed. Also, since the column-shaped section can be prevented from dissolving in the liquid before the second matrix applying layer, effects on the characteristics of the device can be limited.

(4) The filler may have a lower solubility in the liquid than the provisional matrix material which forms the second matrix applying layer. This enables the filler to be prevented from dissolving in the liquid before the provisional matrix material which forms the second matrix applying layer. Therefore, the filler can be included in the resulting insulating layer.

(5) The matrix precursor may be a polyimide resin precursor.

DETAILED DESCRIPTION OF THE EMBODIMENT

Embodiments of the present invention are described below with reference to the drawings.

First Embodiment

Device Structure

Figure 1:
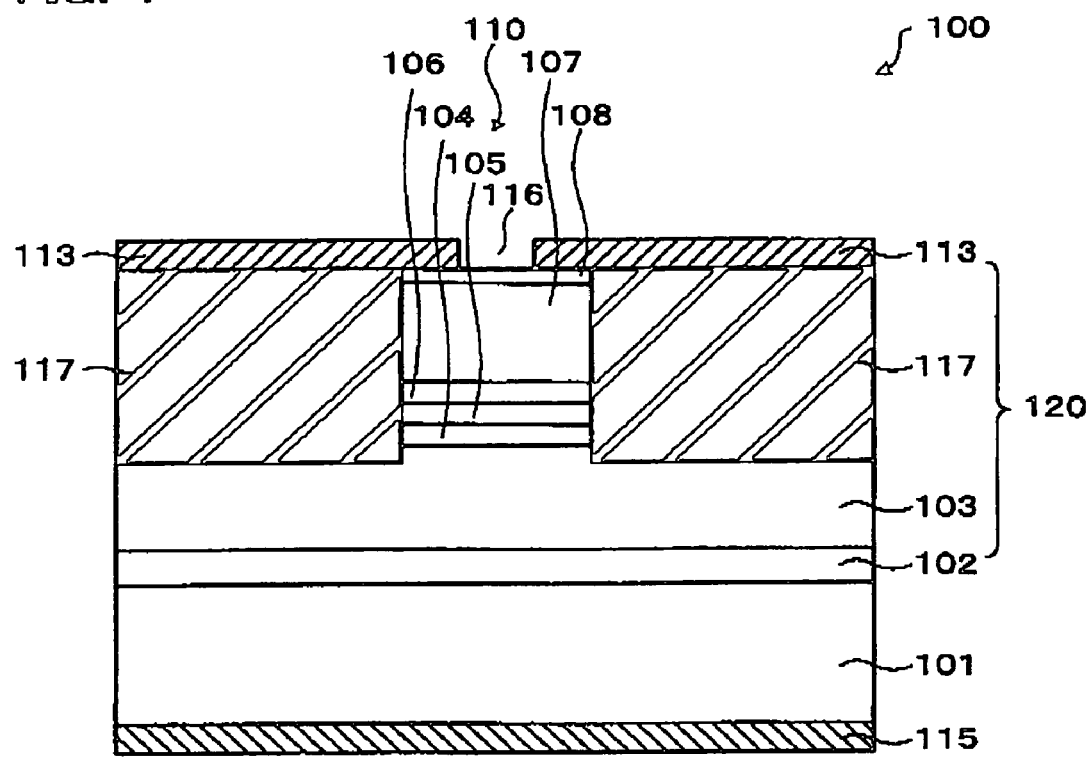
FIG. 1 is a view schematically showing a cross section of a surface-emission type light-emitting device according to a first embodiment of the present invention.

FIG. 1 is a view schematically showing a cross section of a surface-emission type light-emitting device 100 according to a first embodiment of the present invention.

The present embodiment illustrates a case where the surface-emission type light-emitting device 100 is a surface-emitting semiconductor laser. In the surface-emission type light-emitting device 100, an insulating layer 117 is formed on a vertical resonator (hereinafter called "resonator") 120. The surface-emission type light-emitting device 100 includes a semiconductor substrate 101, a buffer layer 102 formed of n-type GaAs on the semiconductor substrate 101, the resonator 120, and a contact layer 108 formed of p-type GaAs on the resonator 120.

A column-shaped semiconductor deposition (column-shaped section) 110 is formed in the resonator 120. The column-shaped section 110, which is part of the resonator 120, is a column-shaped semiconductor deposition including at least an active layer 105. The column-shaped section 110 is buried in the insulating layer 117. The side surface of the column-shaped section 110 is covered with the insulating layer 117. An upper electrode 113 is formed over the column-shaped section 110.

The resonator 120 includes a distributed-reflection type multilayer film mirror 103 formed on the buffer layer 102 in which 30 pairs of n-type $Al_{0.85}Ga_{0.15}As$ layer and an n-type $Al_{0.15}Ga_{0.85}As$ layer are layered alternately (hereinafter called "lower mirror"), an n-type cladding layer 104 formed of n-type $Al_{0.5}Ga_{0.5}As$, the active layer 105 formed of GaAs well layers and $Al_{0.3}Ga_{0.7}As$ barrier layers having a multiple quantum well structure in which the well layers are formed of three layers, a p-type cladding layer 106 formed of $Al_{0.5}Ga_{0.5}As$, and a distributed-reflection type multilayer film mirror 107 in which 25 pairs of a p-type $Al_{0.85}Ga_{0.15}As$ layer and a p-type $Al_{0.15}Ga_{0.85}As$ layer are layered alternately (hereinafter called "upper mirror"). These layers are applied in that order.

The upper mirror 107 is made p-type by Zn doping, and the lower mirror 103 is made n-type by Se doping. Therefore, the upper mirror 107, undoped active layer 105, and lower mirror 103 make up a pin diode.

The resonator 120 is etched from the light exit side of the surface-emission type light-emitting device 100 to the middle of the lower mirror 103 in the shape of a circle when viewed from the light exit side, whereby a column-shaped section 110 is formed. In the present embodiment, the planar shape of the column-shaped section 110 is a circle. However, the column-shaped section 110 may have a different planar shape.

In the surface-emission type light-emitting device 100 according to the present embodiment, the insulating layer 117 is formed to cover the side surface of the column-shaped section 110 and the upper surface of the lower mirror 103.

As a material for forming the insulating layer 117, resins formed by curing by applying energy such as heat or light, such as a polyimide resin, acrylic resin, or epoxy resin may be used.

The upper electrode 113 is formed over the column-shaped section 110 and the insulating layer 117. An opening 116, which becomes a laser exit port, is formed at the center of the upper surface of the column-shaped section 110. A lower electrode 115 is formed on the surface of the semiconductor substrate 101 opposite to the surface on which the resonator 120 is formed. Specifically, in the surface-emission type light-emitting device 100 shown in FIG. 1, the upper electrode 113 is bonded to the column-shaped section 110, and the lower electrode 115 is bonded to the surface of the semiconductor substrate 101 opposite to the surface on which the resonator 120 is formed. Current is injected into the active layer 105 using the upper electrode 113 and the lower electrode 115.

Device Operation

The operation of the surface-emission type light-emitting device 100 according to the first embodiment is described below. The surface-emission type light-emitting device 100 is a surface-emitting semiconductor laser which emits laser light from the opening 116.

When a forward voltage is applied to the pin diode using the upper electrode 113 and the lower electrode 115, electrons and holes are recombined in the active layer 105, thereby causing emission of light to occur. Stimulated emission occurs during a period in which the light reciprocates between the upper mirror 107 and the lower mirror 103, whereby the intensity of light is amplified. Laser oscillation occurs when the optical gain exceeds the optical loss, whereby laser light is emitted from the opening 116 formed in the upper electrode 113 in the direction perpendicular to the semiconductor substrate 101.

Device Fabrication Process

Figure 3:
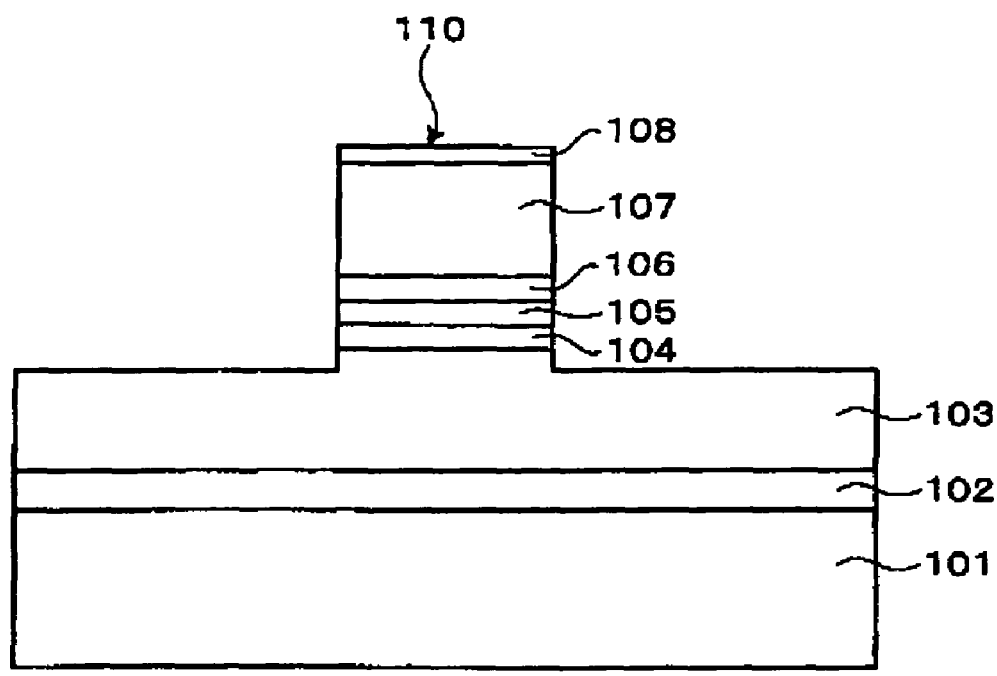
FIG. 3 is a cross-sectional view schematically showing a fabrication step of the surface-emission type light-emitting device shown in FIG. 1.
Figure 4:
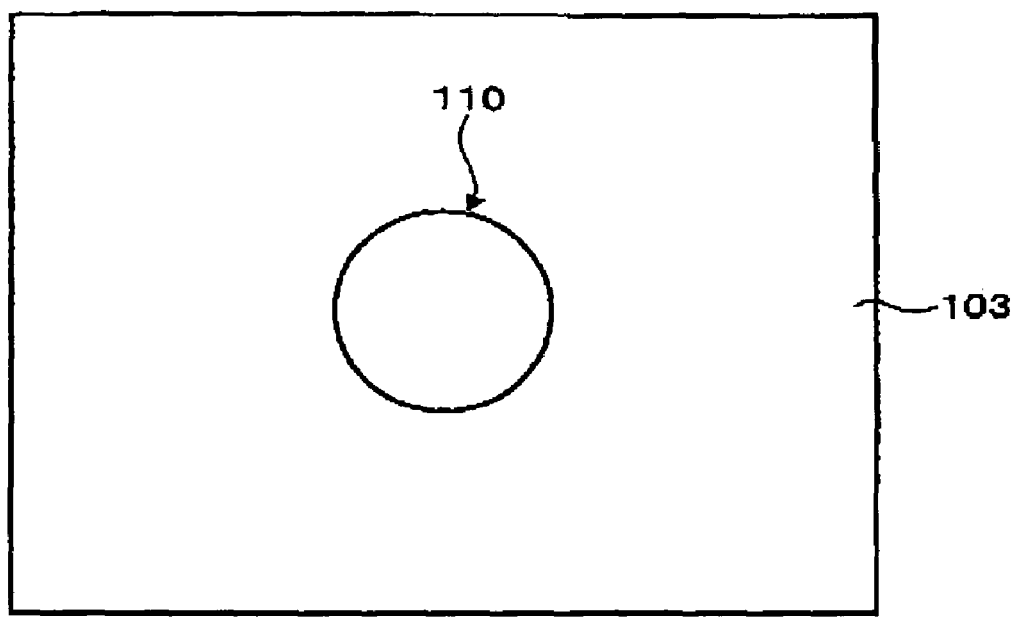
FIG. 4 is a plan view schematically showing the fabrication step shown in FIG. 3.

A method of fabricating the surface-emission type light-emitting device 100 according to the present embodiment is described below with reference to FIGS. 2 to 8. FIGS. 2, 3, and 5 to 8 are cross-sectional views schematically showing steps of fabricating the surface-emission type light-emitting device of the present embodiment. FIG. 4 is a plan view schematically showing the fabrication step shown in FIG. 3.

The surface-emission type light-emitting device 100 of the present embodiment is fabricated by the following steps (a) to (e).

The step (a) includes forming a multilayer film including the active layer 105 on the semiconductor substrate 101, and etching at least a part of the multilayer film, thereby forming the column-shaped section 110 which functions as at least a part of the light-emitting device 100.

The step (b) includes forming a first resin layer 117a so as to cover the column-shaped section 110.

The step (c) includes forming a second resin layer 117b by changing the solubility of the first resin layer 117a in a liquid 130 (described later).

The step (d) includes immersing, for a specific period of time, at least the second resin layer 117b in the liquid 130 having characteristics which cause the second resin layer 117b to be dissolved, thereby removing the second resin layer 117b at least in the area formed over the column-shaped section 110.

The step (e) includes forming the insulating layer 117 which covers the side surface of the column-shaped section 110 by curing a second resin layer 117c.

The step (a) is described below.

Figure 2:
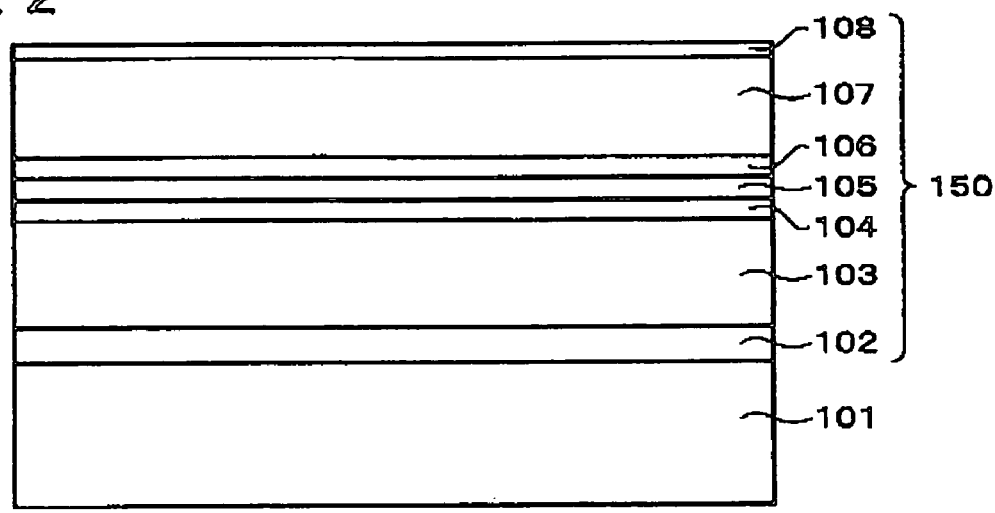
FIG. 2 is a cross-sectional view schematically showing a fabrication step of the surface-emission type light-emitting device shown in FIG. 1.

The semiconductor multilayer film 150 shown in FIG. 2 is epitaxially grown on the surface of the n-type GaAs semiconductor substrate 101 shown in FIG. 2 while changing the composition. The semiconductor multilayer film 150 includes the buffer layer 102 formed of n-type GaAs, the lower mirror 103 in which n-type $Al_{0.85}Ga_{0.15}As$ layers and n-type $Al_{0.15}Ga_{0.85}As$ layers are applied alternately, the n-type cladding layer 104 formed of n-type $Al_{0.5}Ga_{0.5}As$, the active layer 105 formed of GaAs well layers and $Al_{0.3}Ga_{0.7}As$ barrier layers having a multiple quantum well structure in which the well layers are formed of three layers, the p-type cladding layer 106 formed of $Al_{0.5}Ga_{0.5}As$, the upper mirror 107 in which p-type $Al_{0.85}Ga_{0.15}As$ layers and p-type $Al_{0.15}Ga_{0.85}As$ layers are applied alternately, and the contact layer 108 formed of p-type GaAs. The semiconductor multilayer film 150 is formed by depositing these layers on the semiconductor substrate 101 in that order. The surface of the semiconductor substrate 101 is the surface on which the resonator 120 is formed in the steps described later.

The epitaxial growth temperature is appropriately determined according to the type of the semiconductor substrate 101 or the type or thickness of the semiconductor multilayer film 150. The epitaxial growth temperature is preferably 600 to 800° C. A period of time needed for the epitaxial growth is also appropriately determined. As the epitaxial growth method, an Metal-Organic Vapor Phase Epitaxy (MOVPE) method, Molecular Beam Epitaxy (MBE) method, or Liquid Phase Epitaxy (LPE) method may be used.

A photoresist (not shown) is applied to the contact layer 108 and patterned using photolithography, thereby forming a resist layer (not shown) with a specific pattern. Part of the contact layer 108, upper mirror 107, p-type cladding layer 106, active layer 105, n-type cladding layer 104, and lower mirror 103 is dry-etched using the resist layer as a mask, thereby forming the column-shaped section 110 which is a column-shaped semiconductor deposition, as shown in FIGS. 3 and 4. The resonator 120 including the column-shaped section 110 is formed on the semiconductor substrate 101 by this step.

The step (b) is described below.

In this step, the column-shaped section 110 is covered with the first resin layer 117a.

Figure 5:
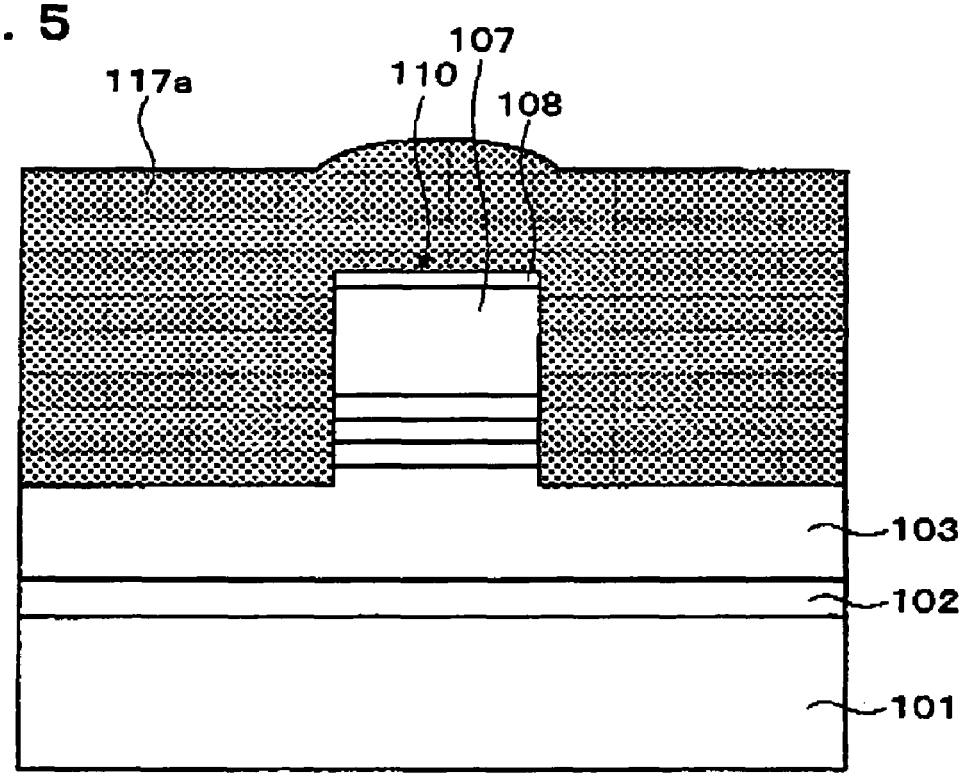
FIG. 5 is a cross-sectional view schematically showing a fabrication step of the surface-emission type light-emitting device shown in FIG. 1.

A liquid substance containing a resin precursor (not shown) is applied to the column-shaped section 110 and the upper mirror 103 and then dried, thereby forming the first resin layer 117a so as to cover the column-shaped section 110, as shown in FIG. 5. In this step, the first resin layer 117a is formed so that the thickness of the first resin layer 117a is greater than at least the height of the column-shaped section 110, and the column-shaped section 110 is covered with the first resin layer 117a. The resin precursor is applied after dissolving in a solvent, as required. In this case, the solvent is evaporated after applying the resin precursor.

As a method of applying the liquid substance, conventional technique such as a spin coating process, dipping process, or spray coating process may be used. During the application, it is preferable to prevent unevenness of the film thickness caused by a convex section formed by the column-shaped section 110 as far as possible.

The step (c) is described below.

Figure 6:
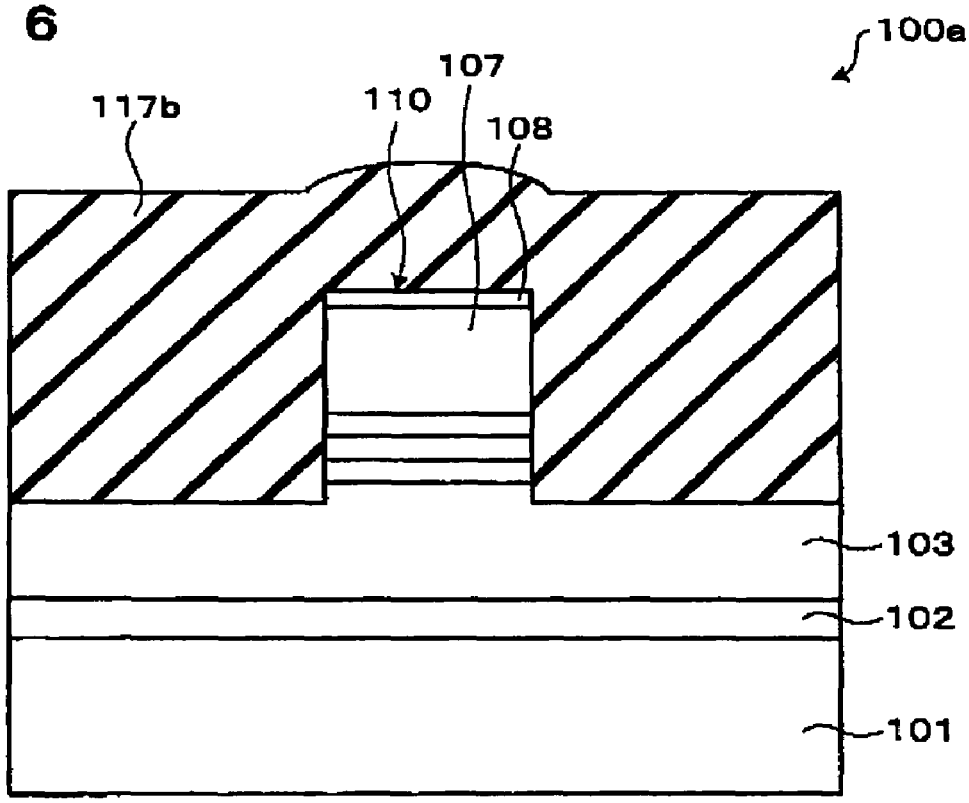
FIG. 6 is a cross-sectional view schematically showing another fabrication step of the surface-emission type light-emitting device shown in FIG. 1.

In this step, the resin precursor in the first resin layer 117a is semi-cured by applying energy such as heat or light to the resin precursor, thereby forming the second resin layer 117b, as shown in FIG. 6. The semi-curing in the step (c) means changing solubility of the first resin layer 117a in the liquid 130 described later. By the semi-curing, the first resin layer 117a converts to the second resin layer 117b. In other words, solubility in the liquid 130 differs between the first resin layer 117a and the second resin layer 117b. In the present embodiment, part of the resin precursor in the first resin layer 117a is reacted by applying energy such as heat or light, whereby the second resin layer 117b having a lower solubility in the liquid 130 than the first resin layer 117a is formed.

This semi-curing step is performed while controlling the period of time for applying energy such as heat or light and the amount of energy to be applied depending on the type of the resin precursor in the first resin layer 117a. In the case of semi-curing the resin precursor using heat, the reaction temperature is controlled. In the case of semi-curing the resin precursor using light, the amount of light is controlled. In the case of forming the second resin layer 117b having a lower solubility in the liquid 130 than the first resin layer 117a by semi-curing the first resin layer 117a using heat, the semi-curing is performed at a temperature lower than that employed in a heat curing step for forming an insulating layer from the first resin layer 117a. If the amount of energy applied is insufficient, the solubility in the liquid 130 is not sufficiently changed, thereby the resin layer dissolves in the liquid 130 and the resin layer is almost removed. If the amount of energy applied is too great, the solubility in the liquid 130 becomes too low, whereby it is difficult to remove the second resin layer 117b in the step described later. Therefore, it is important to control the amount of energy to be applied and the period of time during semi-curing depending on the type of the resin precursor.

As an example of the resin precursor used in this step, a polyimide precursor can be given.

As examples of the polyimide precursor, polyamic acid, long-chain alkyl ester of polyamic acid, and the like can be given. In the case of forming the insulating layer from the polyimide precursor, when the polyimide precursor is applied and then heated, an imidization reaction occurs. As a result, a polyimide resin is produced, whereby the insulating layer is formed. The heating temperature applied when forming the insulating layer is suitably 250 to 400° C., although the temperature is changed depending on the type of the polyimide precursor. In this case, the semi-curing step is preferably performed at 150 to 250° C.

In the case of using a resin cured by light irradiation as the resin used for forming the insulating layer 117 (see FIG. 1), a UV-curable polyacrylic resin or epoxy resin may be used. Since the UV-curable resin can be cured by only irradiation with ultraviolet rays, problems such as changes in the device characteristics due to heat can be avoided.

The step (d) is described below.

Figure 7:
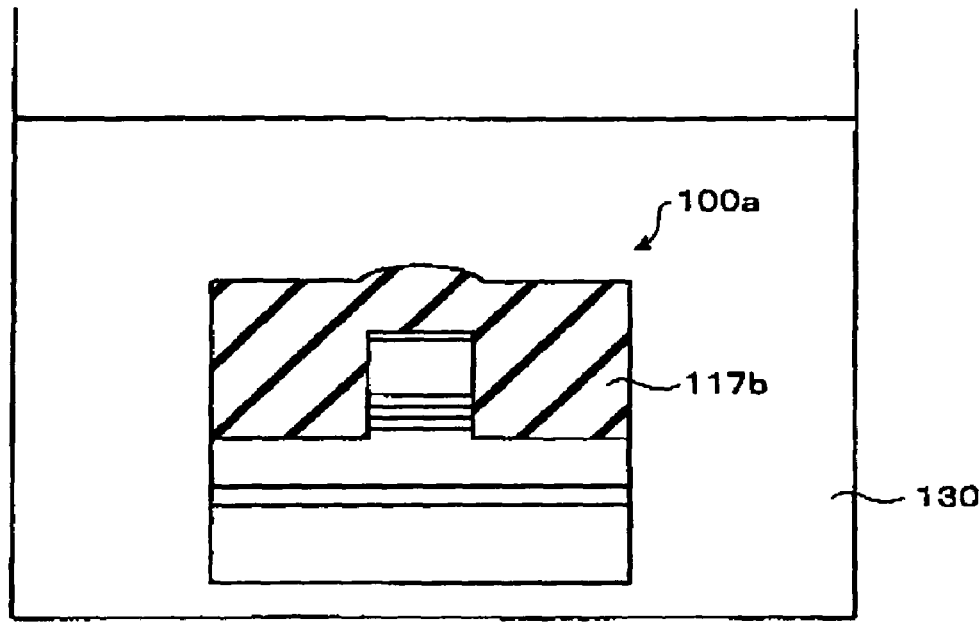
FIG. 7 is a cross-sectional view schematically showing another fabrication step of the surface-emission type light-emitting device shown in FIG. 1.

In this step, a device 100a obtained by the above steps is immersed in the liquid 130 for a specific period of time, as shown in FIG. 7. FIG. 7 illustrates a case where the entire area of the device 100a is immersed in the liquid 130. However, it suffices that at least the second resin layer 117b of the device 100a be immersed.

The liquid 130 has characteristics which cause the second resin layer 117b to be dissolved. The liquid 130 may be appropriately selected corresponding to the characteristics of the resin precursor. For example, a resin precursor having solubility in an alkaline solution may be selected as the resin precursor. In this case, an alkaline solution may be used as the liquid 130.

The liquid 130 preferably has characteristics which cause the second resin layer 117b to be removed. This means that the liquid 130 is introduced into the joint section between the second resin layer 117b and the column-shaped section 110 during the process in which the second resin layer 117 is dissolved in the liquid 130, whereby the second resin layer 117 is removed. If the liquid 130 has characteristics which cause the second resin layer 117b to be removed, the second resin layer 117b can be removed efficiently in the area formed over the column-shaped section 110.

In this step, the solubility of the column-shaped section 110 in the liquid 130 may be lower than the solubility of the second insulating layer 117b in the liquid 130. This enables a sufficient margin to be produced relating to the period of time in which the column-shaped section 110 and the second resin layer 117b are immersed in the liquid 130, thereby enabling stable fabrication. Moreover, since the column-shaped section 110 can be prevented from being dissolved in the liquid 130 before the second resin layer 117b, effects on the device characteristics can be limited.

Figure 8:
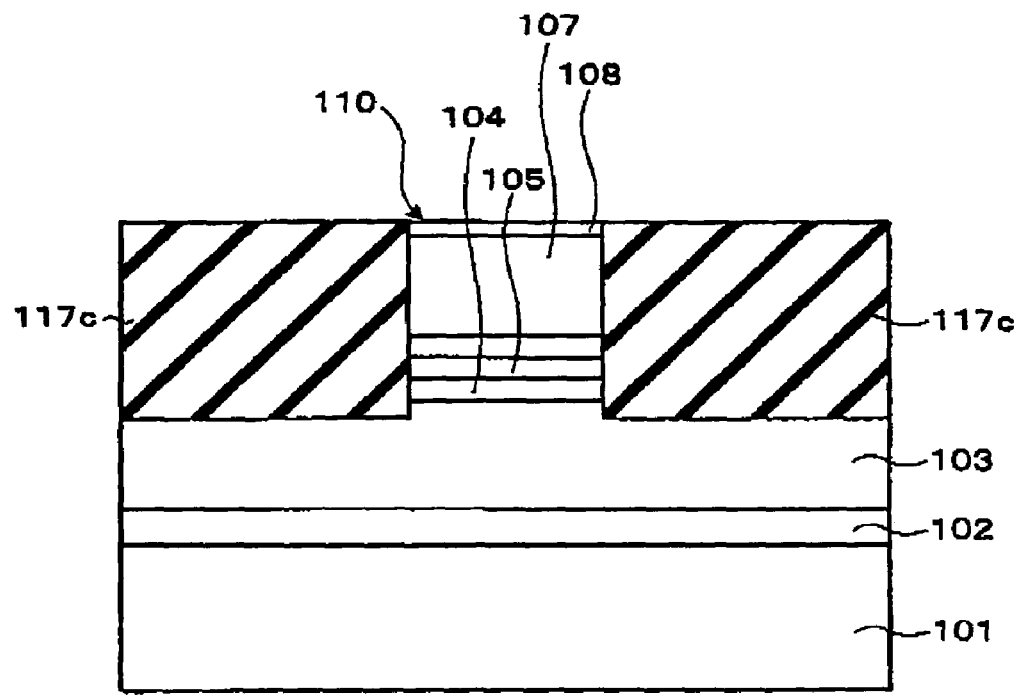
FIG. 8 is a cross-sectional view schematically showing yet another fabrication step of the surface-emission type light-emitting device shown in FIG. 1.

In this step, a second insulating layer 117c is obtained by controlling the period of time and temperature for immersion in the liquid 130, as shown in FIG. 8. The second insulating layer 117c is formed of the second resin layer 117b shown in FIG. 7 of which the area formed over the column-shaped section 110 is removed, as shown in FIG. 8. In this step, the area of the second resin layer 117b formed over the upper mirror 103 is also dissolved in the liquid 130. As a result, the second insulating layer 117c can be formed so that the upper surface of the second insulating layer 117c is almost level with the upper surface of the column-shaped section 110.

The step (e) is described below.

In this step, the insulating layer 117 which covers the side surface of the column-shaped section 110 is formed by curing the second resin layer 117c. The second resin layer 117c is cured at a temperature for a period of time referring to the temperature and period of time in a conventional curing step during formation of an insulating layer. The insulating layer 117 which covers the side surface of the column-shaped section 110 is formed by this step, as shown in FIG. 1.

A step of forming the electrodes 113 and 115 for injecting current into the active layer 105 (step (f)) is described below.

Before forming the electrodes 113 and 115, the upper surface of the column-shaped section 110 is optionally cleaned using a dry etching process or the like. This enables formation of a device having more stable characteristics. After forming an alloy layer of gold or zinc on the upper surfaces of the insulating layer 117 and the column-shaped section 110 using a vacuum deposition process, the alloy layer is patterned using photolithography, thereby forming the opening 116. The upper electrode 113 is formed by this step. The lower electrode 115 is formed of a gold/germanium alloy layer on the back surface of the semiconductor substrate 101 (surface of the semiconductor substrate 101 opposite to the surface on which the resonator 120 is formed) using a vacuum deposition process. The surface-emission type light-emitting device 100 shown in FIG. 1 is obtained by the above process.

Action and Effects

The action and effects of the first embodiment are described below.

According to the method of fabricating the surface-emission type light-emitting device 100 of the present embodiment, the second resin layer 117b can be removed in the area formed over the column-shaped section 110 without causing damage to the column-shaped section 110 in the step (d) by immersing at least the second resin layer 117b in the liquid 130. This enables the device 100 having stable characteristics to be obtained. Moreover, the device 100 can be fabricated at a lower cost and at high yields. Since the greater part of the removed second resin layer 117b is dissolved in the liquid 130, the device characteristics scarcely deteriorate due to the second resin layer 117b readhering to the device 100 after removal.

In the step (c), the second resin layer 117b having a lower solubility in the liquid 130 than the first resin layer 117a is formed by semi-curing the first resin layer 117a. Since the dissolving rate of the second resin layer 117b in the liquid 130 can be decreased by this semi-curing step, a margin during the removal step of the second resin layer 117b in the liquid 130 can be increased.

Second Embodiment

Device Structure

Figure 9:
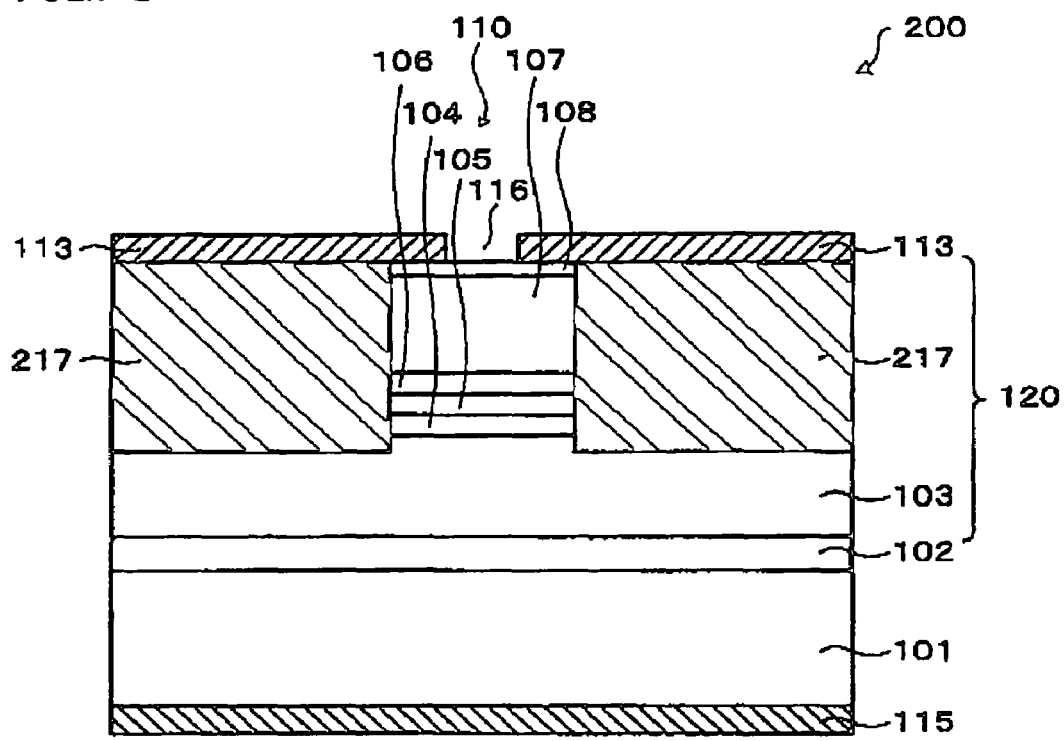
FIG. 9 is a view schematically showing a cross section of a surface-emission type light-emitting device according to a second embodiment of the present invention.

FIG. 9 is a view schematically showing a cross section of a surface-emission type light-emitting device 200 according to a second embodiment of the present invention.

In the surface-emission type light-emitting device 200 according to the present embodiment, the side surface of the column-shaped section 110 is covered with an insulating layer 217. The insulating layer 217 is formed of a first insulating layer 217a (see FIG. 10) containing resin precursor and photosensitive components. The surface-emission type light-emitting device 200 of the present embodiment differs from the surface-emission type light-emitting device 100 of the first embodiment which includes the insulating layer 117 relating to this point. The structure of other sections of the surface-emission type light-emitting device 200 is the same as that of the surface-emission type light-emitting device 100 of the first embodiment. Therefore, further description of these sections is omitted.

Device Operation

The operation of the surface-emission type light-emitting device 200 of the second embodiment is the same as that of the surface-emission type light-emitting device 100 of the first embodiment. Therefore, further description is omitted.

Device Fabrication Process

A method of fabricating the surface-emission type light-emitting device 200 of the present embodiment is described below with reference to FIGS. 2 to 4 and FIGS. 10 to 14. FIGS. 2 to 4 and FIGS. 10 to 14 are cross-sectional views schematically showing steps of fabricating the surface-emission type light-emitting device 200 of the present embodiment.

The surface-emission type light-emitting device 200 of the present embodiment is fabricated by the following steps (a) to (e).

The step (a) includes forming a multilayer film including the active layer 105 on the semiconductor substrate 101, and etching at least a part of the multilayer film, thereby forming the column-shaped section 110 which functions as at least a part of the light-emitting device 200.

The step (b) includes forming a first resin layer 217a so as to cover the column-shaped section 110.

The step (c) includes converting a part of the first resin layer 217a into a second resin layer 217b by exposing the first resin layer 217a for a specific period of time.

The step (d) includes immersing, for a specific period of time, at least the second resin layer 217b in a liquid 230 having characteristics which cause the second resin layer 217b to be dissolved, thereby removing the second resin layer 217b.

The step (e) includes forming an insulating layer 217 which covers the side surface of the column-shaped section 110 by curing the second resin layer 217b.

The step (a) is described below.

As shown in FIGS. 2 to 4, the semiconductor multilayer film 150 is formed on the semiconductor substrate 101, and the resonator 120 including the column-shaped section 110 is formed on the semiconductor substrate 101, in the same manner as in the step (a) of fabricating the surface-emission type light-emitting device 100 of the first embodiment. The step (a) is almost the same as the fabrication step (a) in the first embodiment. Therefore, detailed description is omitted.

The step (b) is described below.

The step (b) includes forming the first resin layer 217a to cover the column-shaped section 110. In this step, the column-shaped section 110 is covered with the first resin layer 217a.

Figure 10:
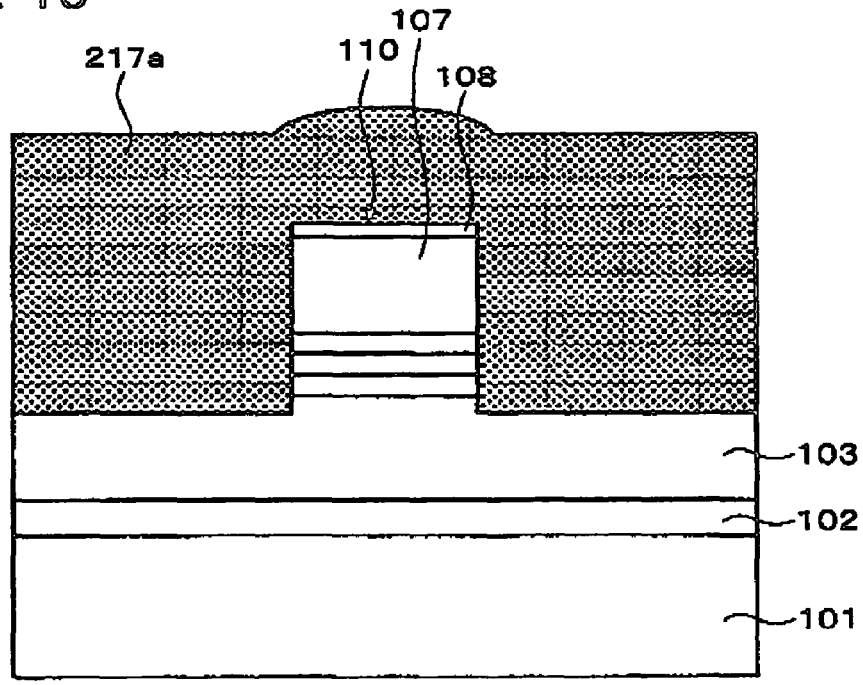
FIG. 10 is a cross-sectional view schematically showing a fabrication step of the surface-emission type light-emitting device shown in FIG. 9.

A liquid substance (not shown) containing a resin precursor and photosensitive components is applied to the column-shaped section 110 and the upper mirror 103 and then dried, thereby forming the first resin layer 217a so as to cover the column-shaped section 110, as shown in FIG. 10. In this step, the first resin layer 217a is formed so that the thickness of the first resin layer 217a is at least greater than the height of the column-shaped section 110, and the column-shaped section 110 is covered with the first resin layer 217a. The liquid substance is applied after dissolving in a solvent, as required. In this case, the solvent is evaporated after the liquid substance is applied. As a method of applying the liquid substance, methods the same as the methods of applying the resin precursor illustrated in the first embodiment may be used.

The step (c) is described below.

Figure 11:
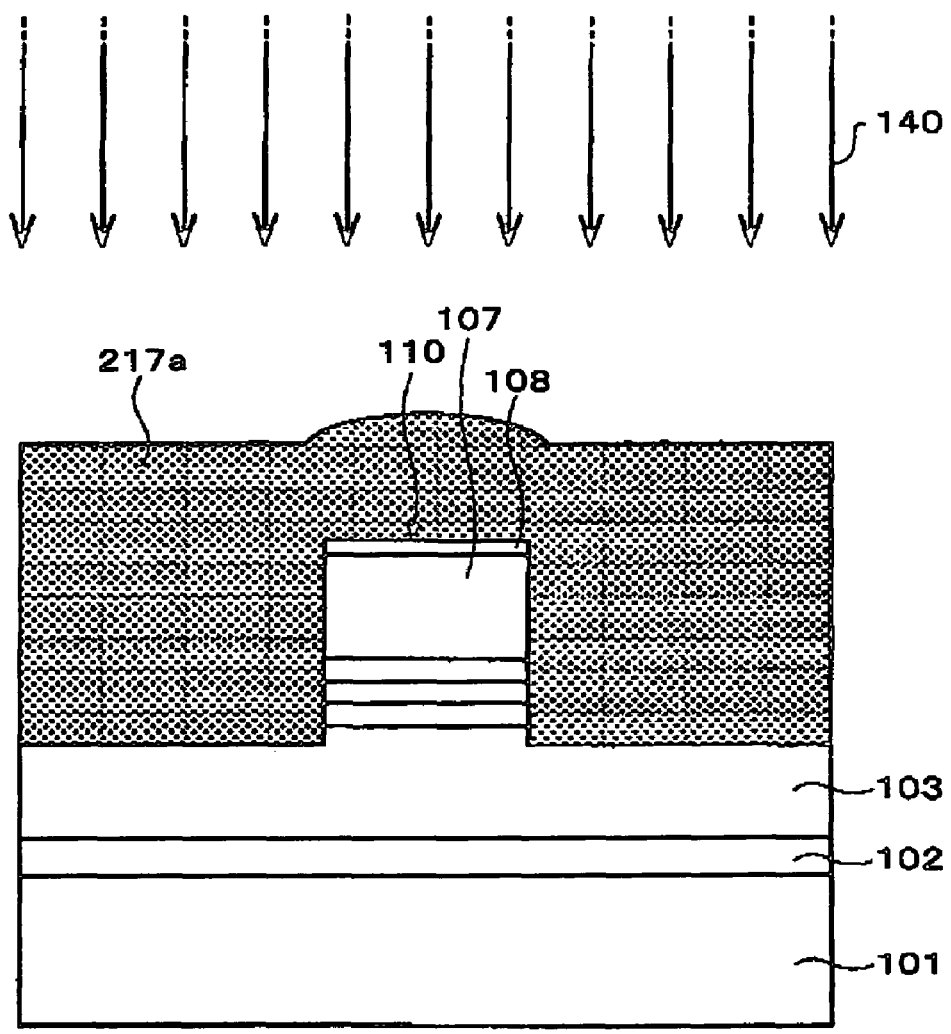
FIG. 11 is a cross-sectional view schematically showing another fabrication step of the surface-emission type light-emitting device shown in FIG. 9.
Figure 12:
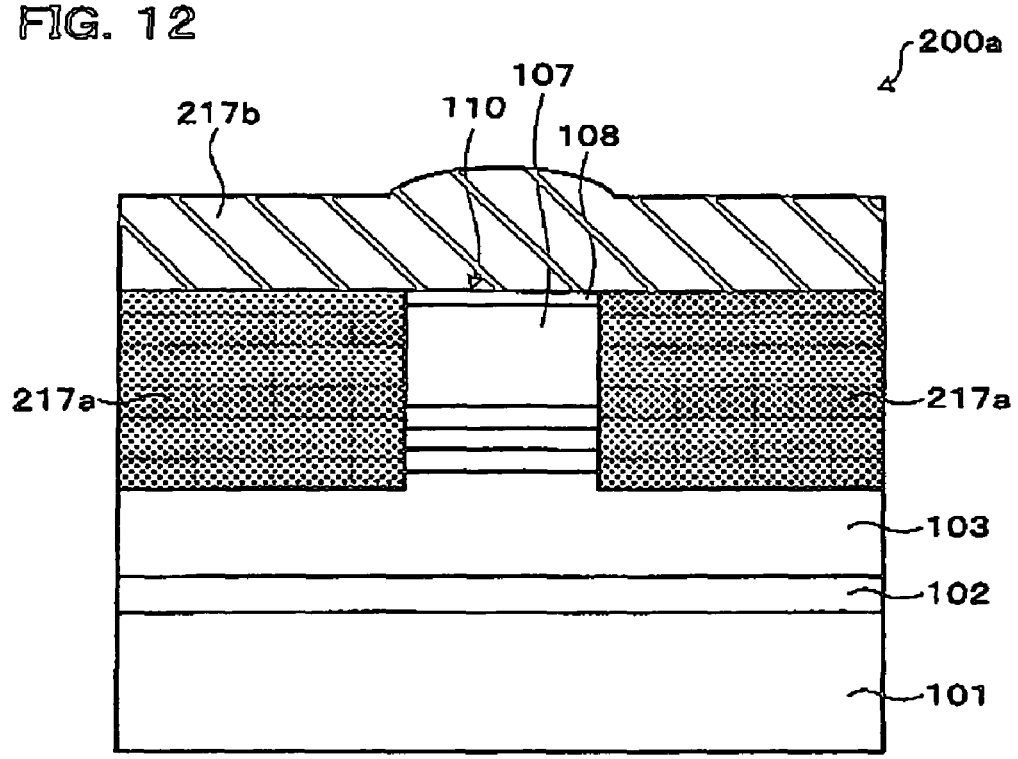
FIG. 12 is a cross-sectional view schematically showing another fabrication step of the surface-emission type light-emitting device shown in FIG. 9.

This step includes converting a part of the first resin layer 217a into the second resin layer 217b by exposing the first resin layer 217a, as shown in FIG. 11. In the present embodiment, the area of the first resin layer 217a formed higher than the upper surface of the column-shaped section 110 is converted into the second resin layer 217b by adjusting the dose of exposure, as shown in FIG. 12. A device 200a is obtained by this step. In the device 200a, the side surface of the column-shaped section 110 is covered with the first resin layer 217a, and the second resin layer 217b is formed on the first resin layer 217a and the column-shaped section 110.

The second resin layer 217b is the first resin layer 217a of which the solubility in the liquid 230 is changed as a result of the reaction of at least a part of the photosensitive components in the first resin layer 217a by exposure. The photosensitive components included in the first resin layer 217a have characteristics by which the solubility in the liquid 230 (see FIG. 12) described later is increased by changes in structure due to reaction by exposure. Specifically, the second resin layer 217b has a higher solubility in the liquid 230 than the first resin layer 217a.

This exposure step is performed while controlling the exposure time and exposure dose depending on the type and density of the photosensitive components included in the first resin layer 217a. In the present embodiment, in the case where a part of the first resin layer 217a is converted into the second resin layer 217b by exposure, the first resin layer 217a is exposed at a dose smaller than that used in the exposure step for forming a common insulating layer from the first resin layer 217a, or the first resin layer 217a is exposed for a period of time shorter than that employed in the exposure step for forming a common insulating layer from the first resin layer 217a. In the case of converting a part of the first resin layer 217a into the second resin layer 217b having a higher solubility in the liquid 230 than the first resin layer 217a by exposing the first resin layer 217a to light, if the dose of exposing light is insufficient, solubility of the resin layer for the liquid 230 is not increased. As a result, the resin layer is scarcely dissolved in the liquid 230, whereby it is difficult to remove the resin layer in the succeeding step. If the dose of exposing light is too great, the entire area of the first resin layer 217a is converted into the second resin layer 217b having a higher solubility in the liquid 230, whereby the entire resin layer is dissolved when immersed in the liquid 230. Therefore, it is important to control the exposure time and dose during exposure depending on the type of the photosensitive components.

As an example of the resin precursor used in this step, a positive-tone photosensitive polyimide precursor can be given.

The step (d) is described below.

Figure 13:
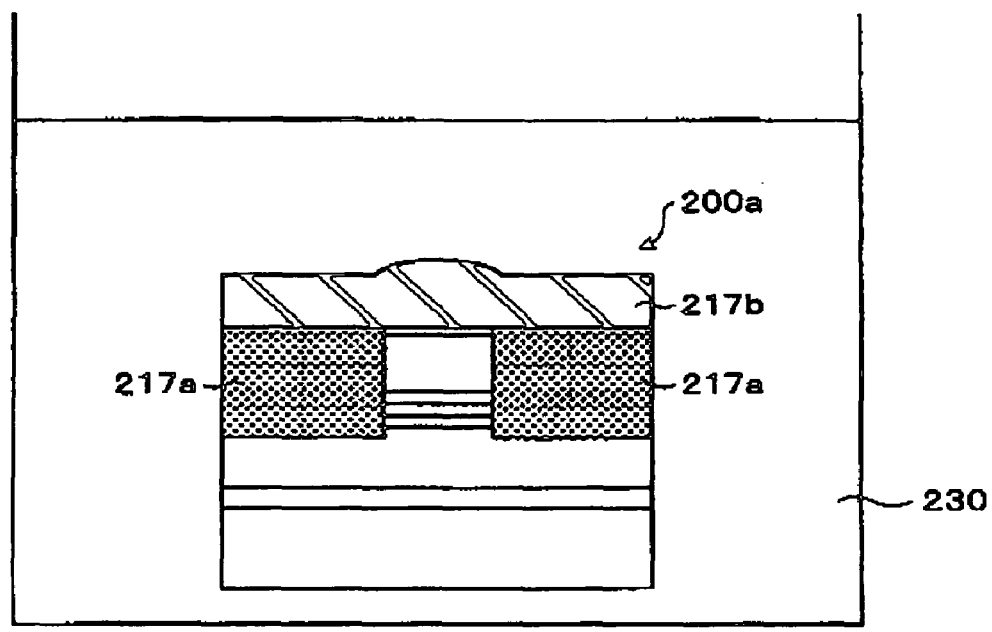
FIG. 13 is a cross-sectional view schematically showing another fabrication step of the surface-emission type light-emitting device shown in FIG. 9.
Figure 14:
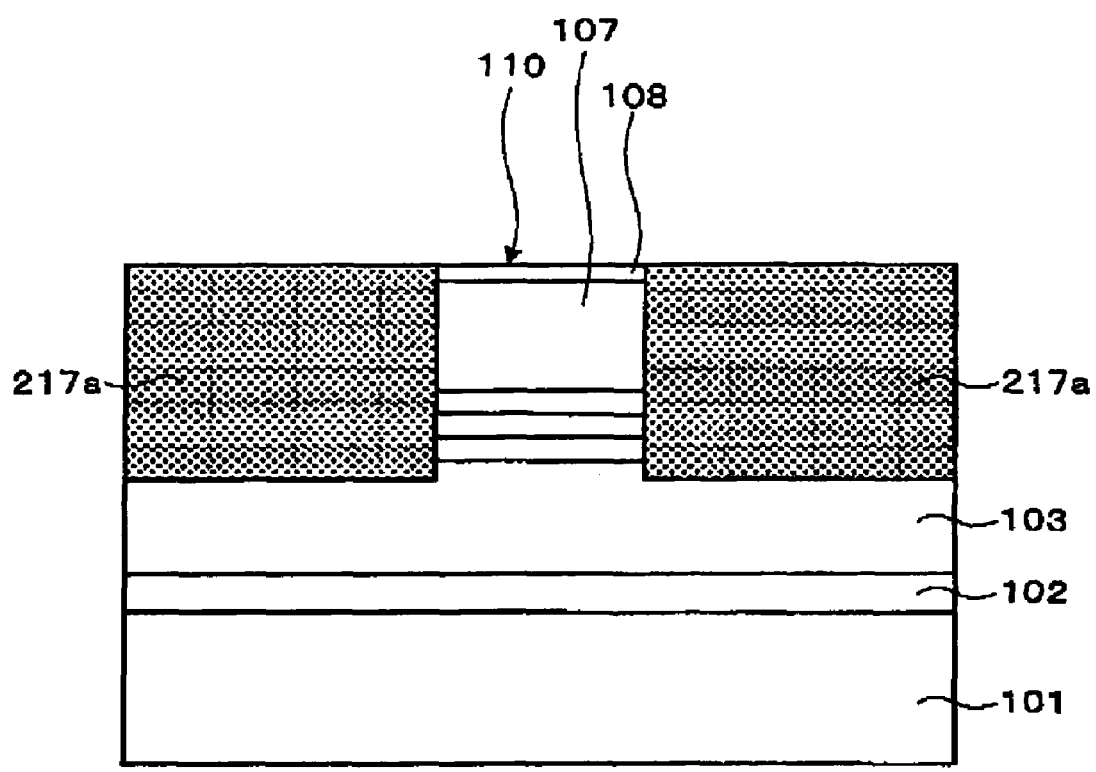
FIG. 14 is a cross-sectional view schematically showing yet another fabrication step of the surface-emission type light-emitting device shown in FIG. 9.

In this step, the device 200a obtained by the above steps is immersed in the liquid 230 for a specific period of time, as shown in FIG. 13. FIG. 13 illustrates a case where the entire area of the device 200a is immersed in the liquid 230. However, it suffices that the second resin layer 217b of the device 200a be immersed in the liquid 230.

The liquid 230 has characteristics which cause the second resin layer 217b to be dissolved. The liquid 230 may be appropriately selected corresponding to the characteristics of the resin precursor and the photosensitive components which make up the second resin layer 217b.

The liquid 230 may have characteristics which cause the second resin layer 217b to be removed. This enables effects the same as by the liquid 130 to be achieved.

In this step, the solubility of the column-shaped section 110 in the liquid 230 may be lower than the solubility of the second insulating layer 217b in the liquid 230. This enables effects the same as by the liquid 130 to be achieved.

In this step, the second insulating layer 217b shown in FIG. 13 is removed by controlling the period of time and temperature for immersion in the liquid 230 in the same manner as in the device of the first embodiment shown in FIG. 8. As a result, the first resin layer 217a which covers the side surface of the column-shaped section 110 and forms almost the same plane as the upper surface of the column-shaped section 110 is obtained. The insulating layer 217 which covers the side surface of the column-shaped section 110 is formed by curing the first insulating layer 217a using the same method as the method of curing the second resin layer 117c in the step of fabricating the surface-emission type light-emitting device 100 of the first embodiment, as shown in FIG. 9.

The succeeding steps are the same as those of the steps of fabricating the surface-emission type light-emitting device 100 of the first embodiment. Therefore, description of these steps is omitted. The surface-emission type light-emitting device 200 shown in FIG. 9 is obtained by the above process.

Action and Effects

The action and effects of the second embodiment are described below.

According to the method of fabricating the surface-emission type light-emitting device 200 of the second embodiment, only the second resin layer 217b can be removed without causing damage to the column-shaped section 110 by immersing the second resin layer 217b in the liquid 230 for a specific period of time and removing the second resin layer 217b. This enables the device 200 having stable characteristics to be obtained in the same manner as the surface-emission type light-emitting device 100 of the first embodiment. Moreover, the device 200 can be fabricated at a lower cost and at high yields. Since the greater part of the removed second resin layer 217b is dissolved in the liquid 230, the device characteristics scarcely deteriorate due to the second resin layer 217b readhering to the device 200 after removal.

In the step (c), a part of the first resin layer 217a is converted into the second resin layer 217b having a lower solubility in the liquid 230 than the first resin layer 217a by exposing the first resin layer 217a. Since the dissolving rate of the second resin layer 217b in the liquid 230 can be increased by this exposure step, only the second resin layer 217b can be removed efficiently.

The surface-emission type light-emitting device 200 of the second embodiment and the method of fabricating the same have the same effects and advantages as the surface-emission type light-emitting device 100 of the first embodiment and the method of fabricating the same.

Third Embodiment

Device Structure

Figure 15:
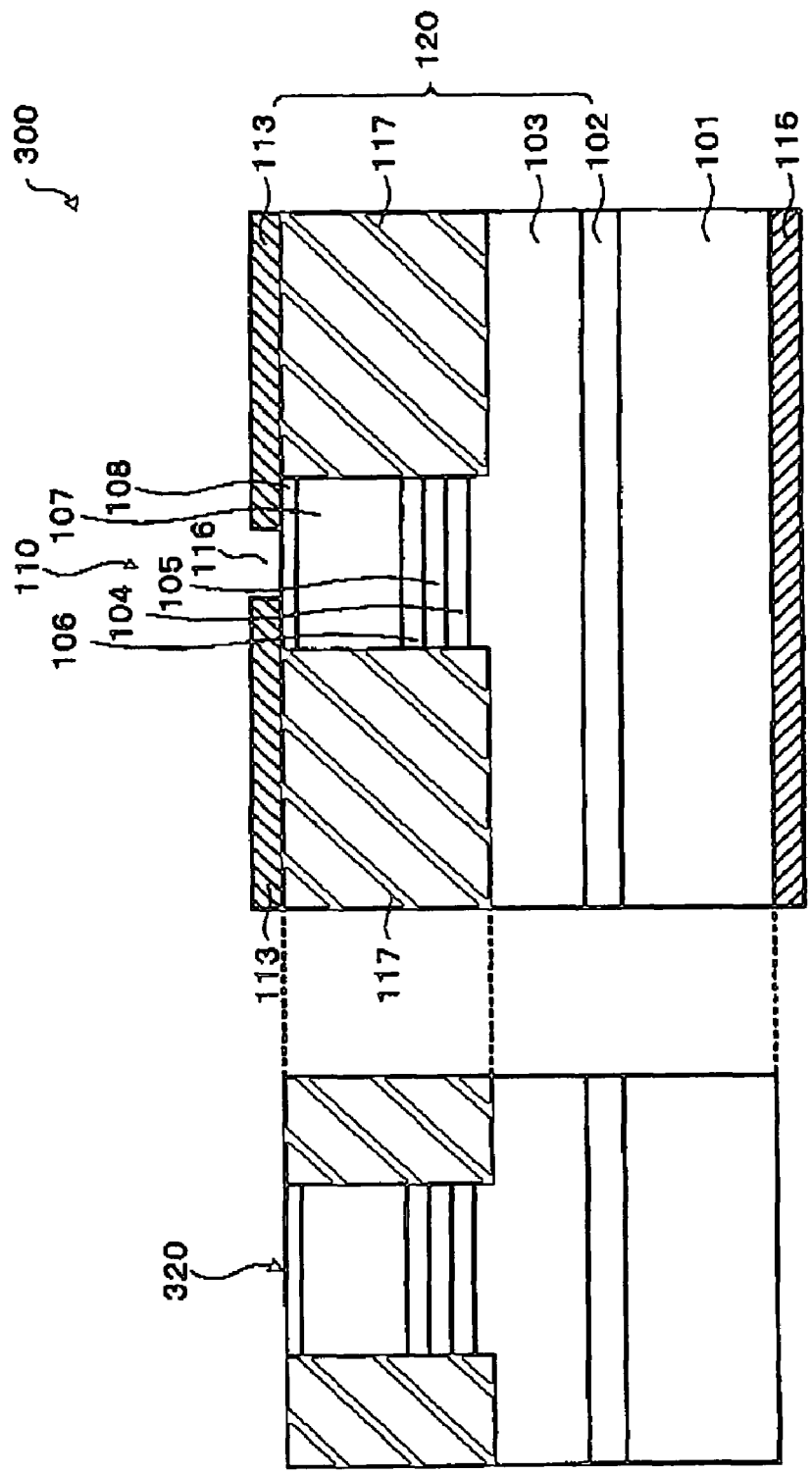
FIG. 15 is a view schematically showing a cross section of a surface-emission type light-emitting device according to a third embodiment of the present invention.
Figure 16:
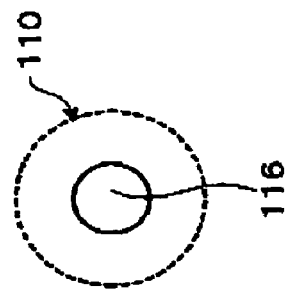
FIG. 16 is a plan view schematically showing the surface-emission type light-emitting device shown in FIG. 15.
Figure 16:
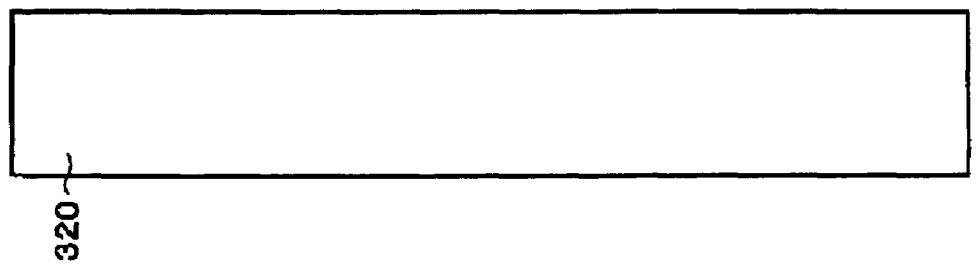

FIG. 15 is a view schematically showing a cross section of a surface-emission type light-emitting device 300 according to a third embodiment of the present invention. FIG. 16 is a plan view schematically showing the surface-emission type light-emitting device 300 shown in FIG. 15.

Figure 17:
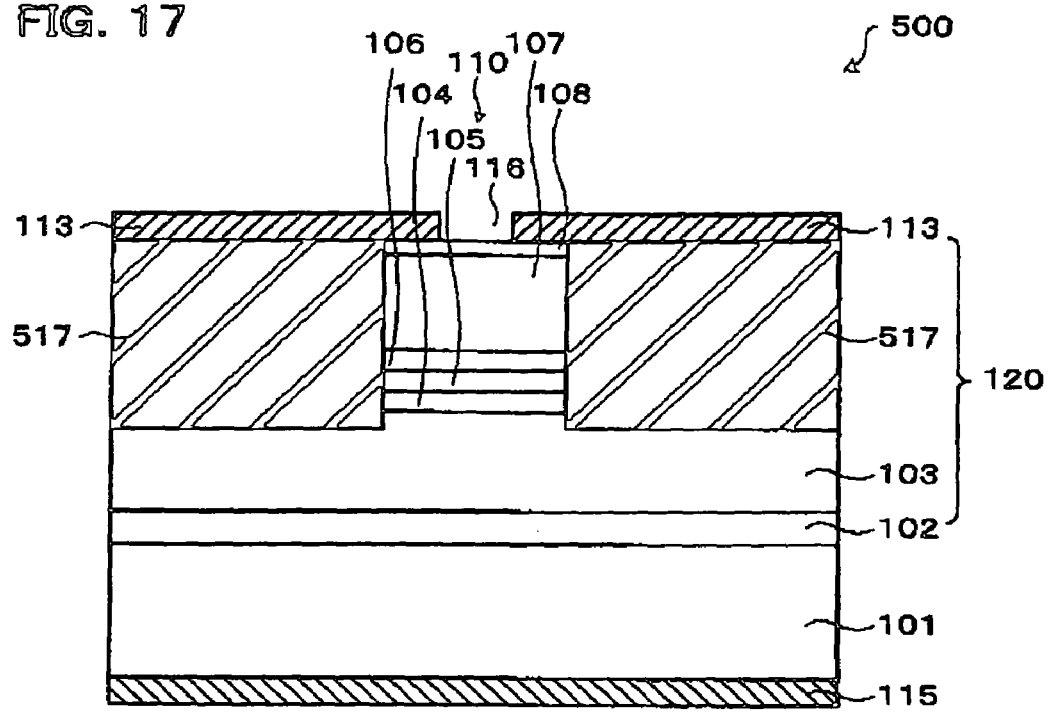
FIG. 17 is a view schematically showing a cross section of a common surface-emission type light-emitting device.
Figure 18:
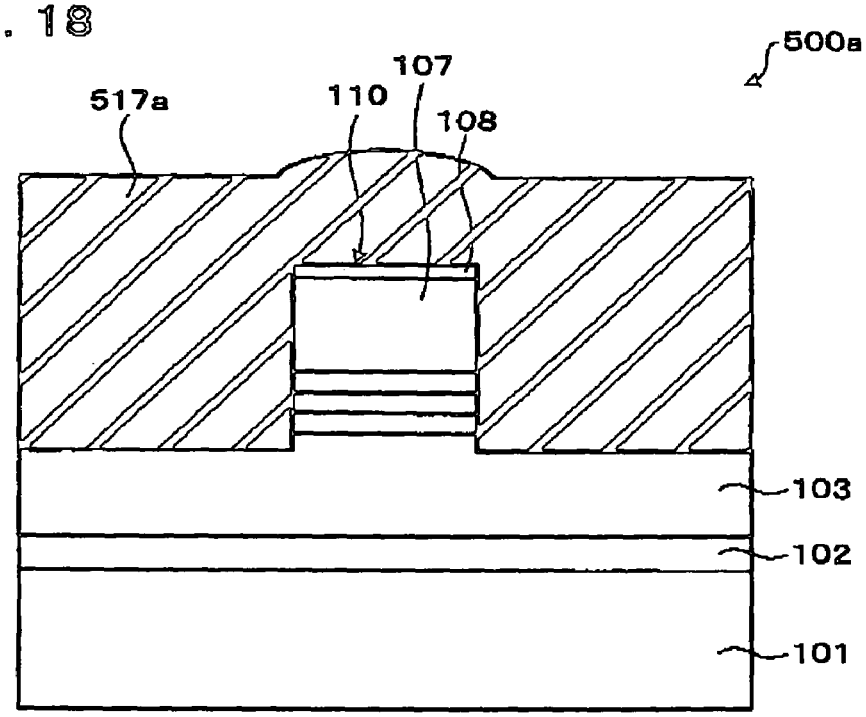
FIG. 18 is a cross-sectional view schematically showing a fabrication step of the common surface-emission type light-emitting device shown in FIG. 17.
Figure 19:
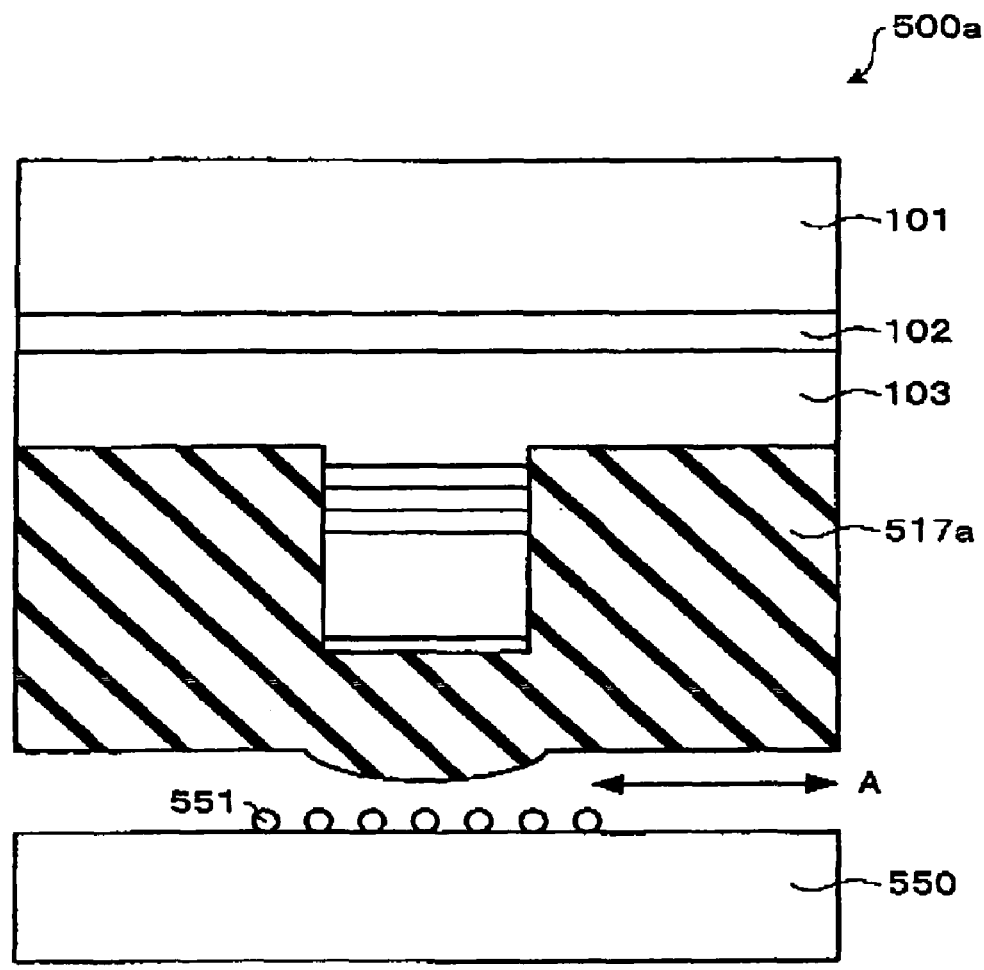
FIG. 19 is a cross-sectional view schematically showing another fabrication step of the common surface-emission type light-emitting device shown in FIG. 17.

The surface-emission type light-emitting device 300 of the present embodiment includes a monitoring section 320 formed near the column-shaped section 110, as shown in FIGS. 15 and 16, in addition to the same structure as the surface-emission type light-emitting device 100 of the first embodiment. The monitoring section 320 is formed by the same patterning step as the column-shaped section 110. In the fabrication step of the surface-emission type light-emitting device 300, the insulating layer 117 shown in FIG. 17 is formed in the same step as the surface-emission type light-emitting device 100 of the first embodiment. Specifically, the second resin layer 117b is removed in the area formed over the column-shaped section 110 by immersing at least the second resin layer 117b in the liquid 130 (see FIG. 8) for a specific period of time, whereby the insulating layer 117 is formed.

The monitoring section 320 is provided to monitor the degree of removal of the second resin layer 117b in the step of removing the second resin layer 117b from the area formed over the column-shaped section 110 by immersing at least the second resin layer 117b in the liquid 130 for a specific period of time. For example, the reflectance on the upper surface of the monitoring section 320 is changed when the second resin layer 117b is removed in the area present on the upper surface of the monitoring section 320 in the case of immersing the monitoring section 320, the column-shaped section 110 and the second resin layer 117b in the liquid 130. The degree of removal of the second resin layer 117b can be confirmed by measuring the changes in reflectance on the upper surface of the monitoring section 320. This enables the removal of the second resin layer 117b formed over the column-shaped section 110 to be controlled.

The planar shape of the monitoring section 320 is preferably rectangular. The ratio of the long side to the short side of this rectangle is preferably greater. This enables the conditions under which the second resin layer 117b is removed in the area present on the upper surface of the monitoring section 320 in the liquid 130 to be detected precisely.

Device Fabrication Process

The surface-emission type light-emitting device 300 of the present embodiment is fabricated essentially by the same steps as the surface-emission type light-emitting device 100 of the first embodiment except that the monitoring section 320 is formed by the same step as the step of forming the column-shaped section 110 by patterning. Specifically, in the fabrication steps of the surface-emission type light-emitting device 100 of the first embodiment, the monitoring section 320 is formed at the same time as the column-shaped section 110 by the patterning step shown in FIGS. 3 and 4. Since other steps are the same as the steps for fabricating the surface-emission type light-emitting device 100, description of these steps is omitted.

Device Operation

The operation of the surface-emission type light-emitting device 300 of the present embodiment is the same as that of the surface-emission type light-emitting devices 100 and 200 of the first and the second embodiments. Therefore, description thereof is omitted.

Action and Effects

The action and effects of the surface-emission type light-emitting device 300 of the present embodiment and the method of fabricating the same are almost the same as those of the surface-emission type light-emitting device 100 of the first embodiment and the method of fabricating of the same. The third embodiment has the following additional action and effects.

Since the monitoring section 320 is formed near the column-shaped section 110, the removal or non-removal of the second resin layer 117b in the area formed over the column-shaped section 110 can be detected. As a result, the second resin layer 117b can be removed more reliably in the area formed over the column-shaped section 110 without causing damage to the column-shaped section 110. This enables the device 300 having stable characteristics to be fabricated at high yields.

In the first to third embodiments, the p-type and n-type layers in each semiconductor layer may be replaced by the n-type and p-type layers, respectively. Such a modification is within the scope of the present invention. The above embodiments illustrate the case of using AlGaAs materials. Other materials such as GaInP, ZnSSe, InGaN, or GaAsSb semiconductor materials may be used depending on the oscillation wavelength.

The first to third embodiments illustrate the case where the surface-emission type light-emitting device is a surface-emitting semiconductor laser. However, the surface-emission type light-emitting device is not limited to the surface-emitting semiconductor laser. The surface-emission type light-emitting device is a light-emitting device which emits light in the direction perpendicular to the substrate. As the surface-emission type light-emitting device applicable to the present invention, an LED device, a semiconductor light amplification device, and the like can be given in addition to the surface-emitting semiconductor laser.

The above method of driving the surface-emission type light-emitting device is only an example. Various modifications and variations are possible within the scope of the present invention. The above embodiments illustrate the surface-emission type light-emitting device having one column-shaped section. However, the present invention is not impaired even if a plurality of column-shaped sections is provided on the substrate.

Fourth Embodiment

Device Structure

Figure 20:
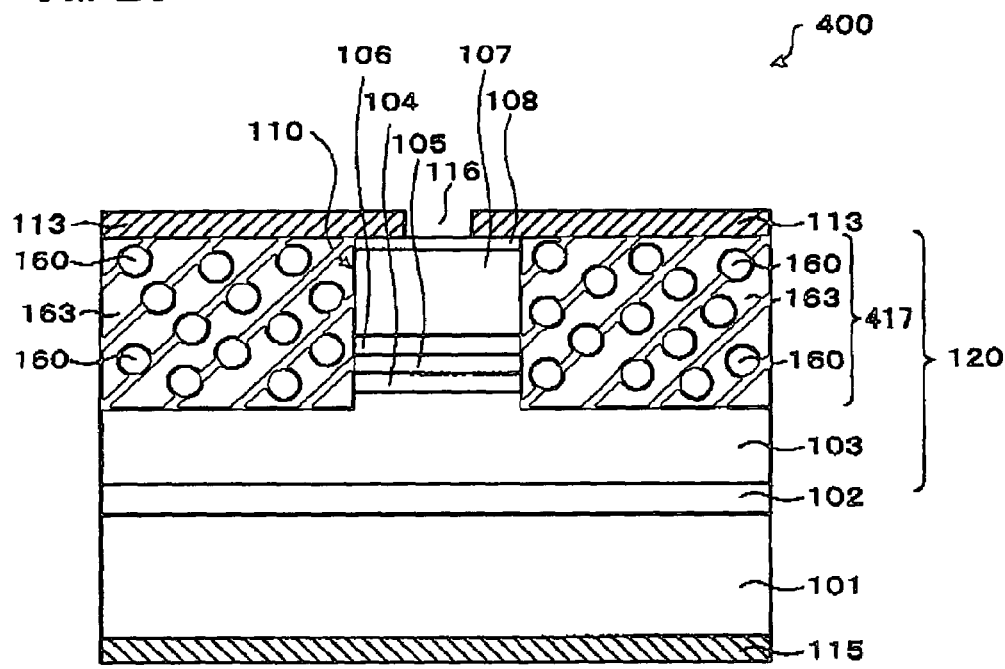
FIG. 20 is a view schematically showing a cross section of a surface-emission type light-emitting device (surface-emitting semiconductor laser) according to a fourth embodiment of the present invention.

FIG. 20 is a cross-sectional view schematically showing a cross section of a surface-emission type light-emitting device of the present embodiment. The present embodiment illustrates a case where the surface-emission type light-emitting device is a surface-emitting semiconductor laser (hereinafter called "surface-emitting laser") 400.

In the surface-emitting laser 400 of the present embodiment, the insulating layer 417 is formed on the resonator 120. The surface-emitting laser 400 includes the semiconductor substrate 101 formed of GaAs, the buffer layer 102 formed of n-type GaAs on the semiconductor substrate 101, the resonator 120, and the contact layer 108 formed of p-type GaAs on the resonator 120.

The column-shaped semiconductor deposition (column-shaped section) 110 is formed in the resonator 120. The column-shaped section 110, which is part of the resonator 120, is a column-shaped semiconductor deposition including at least the contact layer 108 and the upper mirror 107. The column-shaped section 110 is buried in the insulating layer 417. Specifically, the side surface of the column-shaped section 110 is covered with the insulating layer 417. The upper electrode 113 is formed over the column-shaped section 110.

The resonator 120 includes the distributed-reflection type multilayer film mirror 103 formed on the buffer layer 102 in which 30 pairs of an n-type AlAs layer and an n-type $Al_{0.15}Ga_{0.85}As$ layer are applied alternately (hereinafter called "lower mirror"), the n-type cladding layer 104 formed of n-type $Al_{0.5}Ga_{0.5}As$, the active layer 105 formed of GaAs well layers and $Al_{0.3}Ga_{0.7}As$ barrier layers having a multiple quantum well structure in which the well layers are formed of three layers, the p-type cladding layer 106 formed of $Al_{0.5}Ga_{0.5}As$, and the distributed-reflection type multilayer film mirror 107 in which 25 pairs of a p-type $Al_{0.85}Ga_{0.15}As$ layer and a p-type $Al_{0.15}Ga_{0.85}As$ layer are applied alternately (hereinafter called "upper mirror"). These layers are formed in that order.

The upper mirror 107 is made p-type by Zn doping, and the lower mirror 103 is made n-type by Si doping. Therefore, the upper mirror 107, undoped active layer 105, and lower mirror 103 make up a pin diode.

The resonator 120 is etched from the light exit side of the surface-emitting laser 400 to the middle of the lower mirror 103 in the shape of a circle when viewed from the light exit side, whereby the column-shaped section 110 is formed. In the present embodiment, the planar shape of the column-shaped section 110 is a circle. However, the column-shaped section 110 may have a different planer shape.

In the surface-emitting laser 400 according to the present embodiment, the insulating layer 417 is formed to cover the side surface of the column-shaped section 110 and the upper surface of the lower mirror 103.

The insulating layer 417 is formed of a matrix material in which fillers 160 are mixed. The present embodiment illustrates a case in which the matrix material forming the insulating layer 417 is a resin 163 (see FIG. 20). The resin 163 is formed by curing by irradiation with energy such as heat or light or by a chemical reaction.

In the fabrication of the surface-emitting laser 400, after forming the insulating layer 417 which covers the side surface of the column-shaped section 110, an annealing step for forming the electrodes 113 and 115 respectively on the upper surface of the column-shaped section 110 and the back surface of the semiconductor substrate 101 (the surface of the semiconductor substrate 101 opposite to the surface on which the resonator 120 is formed) is performed at about 400° C. (refer to fabrication process described later). Therefore, the matrix material (resin 163 in the present embodiment) which forms the insulating layer 417 must excel in heat resistance to withstand this annealing step. Since the column-shaped section 110 is generally formed at a height of about 3 µm or more, the resin 163 which forms the insulating layer 417 must be formed flat with a thickness of at least about 3 µm. In order to satisfy the above requirements, the resin 163 is preferably a polyimide resin, acrylic resin, or epoxy resin, and particularly preferably a polyimide resin.

The insulating layer 417 includes the fillers 160, as shown in FIG. 20. FIG. 20 illustrates the case where the fillers 160 are spherical. However, the shape of the fillers 160 is not limited thereto. The fillers 160 may be plate-shaped, fibrous, amorphous, hollow, or the like. The size of the fillers 160 is not limited. It is preferable that the entire area of the fillers 160 be covered with the insulating layer 417. Therefore, the particle diameter of the fillers 160 is preferably smaller than the thickness of the insulating layer 417. The insulating layer 417 may be formed using a plurality of fillers having different particle diameters. This enables the filling density of the fillers 160 in the insulating layer 417 to be increased.

The fillers 160 may be formed of a material having a thermal conductivity greater than that of the resin 163 which forms the insulating layer 417. This ensures that heat generated from the resonator 120 at the time of driving the surface-emitting laser 400 and moved to the insulating layer 417 is diffused immediately through the fillers 160 in the direction opposite to the column-shaped section 110. This prevents an increase in temperature of the resonator 110. As a result, a decrease in characteristics of the device due to heat can be prevented, whereby stable characteristics can be maintained.

The fillers 160 may be formed of a material having a coefficient of thermal expansion differing from that of the resin 163 which forms the insulating layer 417. The reasons therefor are described later.

As the material for the fillers 160, silicon, carbon allotropes, metals, and the like may be used. As examples of carbon allotropes, diamond, graphite, carbon black, and the like can be given. As examples of metals, aluminum, gold, silver, copper, tin, magnesium, nickel, and zinc can be given. In the case using a metal for the fillers 160, a metal with an insulating film such as an oxide film or nitride film formed on the surface may be used. The insulating film formed on the surface increases insulation properties of the fillers.

In the case where the fillers 160 contain at least one metal among the above metals as an essential component, since these metals excel in thermal conductivity, heat generated from the resonator 120 can be quickly diffused to the outside through the fillers 160. This enables stabilization of the characteristics of the device.

The fillers 160 may be formed of an insulating material. If the fillers 160 are formed of an insulating material, the upper electrode 113 and the lower electrode 115 can be insulated reliably. As examples of the insulating material, diamond, carbon, silicon, aluminum nitride, aluminum oxide, silicon carbide (silicon nitride), silicon oxide, silicon nitride, boron carbide, and the like can be given. In particular, diamond and aluminum nitride is preferably used as the material for the fillers 160 because of its excellent thermal conductivity and insulation properties.

The upper electrode 113 is formed over the column-shaped section 110 and the insulating layer 417. The opening 116, which becomes a laser exit port, is formed at the center of the upper surface of the column-shaped section 110. The lower electrode 115 is formed on the back surface of the semiconductor substrate 101. Specifically, in the surface-emitting laser 400 shown in FIG. 20, the upper electrode 113 is bonded to the column-shaped section 110, and the lower electrode 115 is bonded to the surface of the semiconductor substrate 101 opposite to the resonator 120. Current is injected into the active layer 105 using the upper electrode 113 and the lower electrode 115.

Device Operation

The operation of the surface-emitting laser 400 according to the fourth embodiment is described below. The method of driving the surface-emitting semiconductor laser described below is only an example. Various modifications and variations are possible within the scope of the present invention.

When a forward voltage is applied to the pin diode using the upper electrode 113 and the lower electrode 115, electrons and holes are recombined in the active layer 105, thereby causing emission of light to occur. Stimulated emission occurs during a period in which the light generated reciprocates between the upper mirror 107 and the lower mirror 103, whereby the intensity of light is amplified. Laser oscillation occurs when the optical gain exceeds the optical loss, whereby laser light is emitted perpendicularly to the surface of the semiconductor substrate 101 from the opening 116 formed on the upper surface of the column-shaped section 110. The surface of the semiconductor substrate 101 is the surface on which the resonator 120 is formed.

Device Fabrication Process

Figure 22:
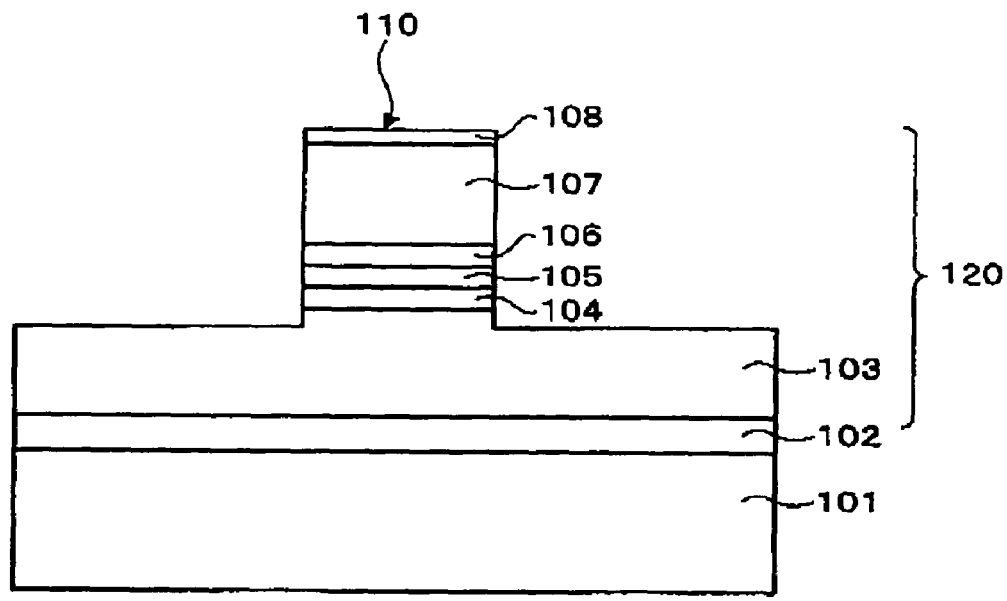
FIG. 22 is a cross-sectional view schematically showing another fabrication step of the surface-emitting semiconductor laser shown in FIG. 20.
Figure 23:
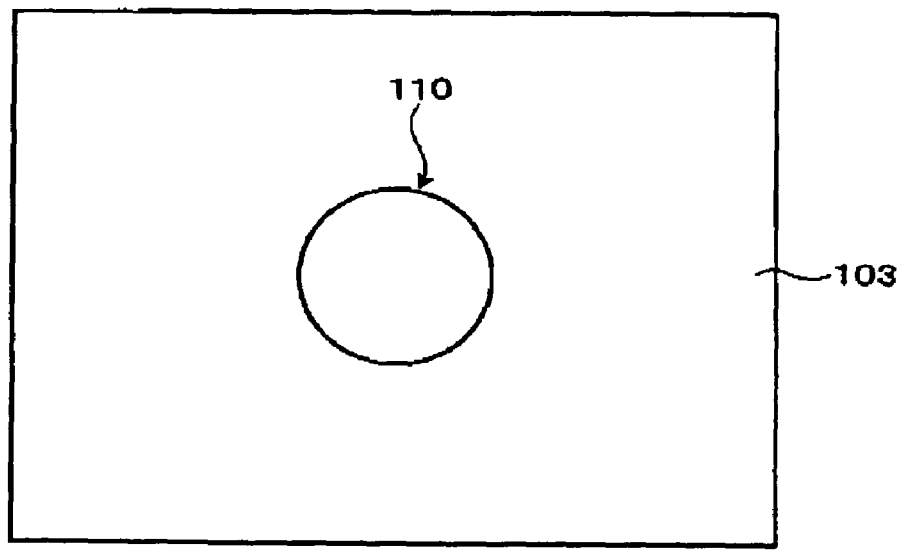
FIG. 23 is a plan view schematically showing the fabrication step shown in FIG. 22.

An example of a method of fabricating the surface-emitting laser 400 according to the present embodiment is described below with reference to FIGS. 21 to 27. FIGS. 21, 22, and 24 to 27 are cross-sectional views, each schematically showing a step of fabricating the surface-emitting laser 400 of the present embodiment shown in FIG. 20. FIG. 23 is a plan view schematically showing the fabrication step shown in FIG. 22.

The present embodiment illustrates a case of fabricating the surface-emitting laser 400 using the method of fabricating the surface-emission type light-emitting device of the first embodiment (see FIGS. 1 to 8).

The surface-emitting laser 400 of the present embodiment is fabricated by the following steps (a) to (e).

The step (a) includes forming a multilayer film 150 on the semiconductor substrate 101, and etching at least a part of the multilayer film 150, thereby forming the column-shaped section 110 including at least the active layer 105.

The step (b) includes forming the first matrix applying layer including the fillers 160 and a matrix precursor to cover the column-shaped section 110. In the present embodiment, the matrix precursor is used as the resin precursor 161 and a case in which the first matrix applying layer is used as the first resin layer 417a will be described.

The step (c) includes forming the second matrix applying layer including the fillers 160 and the provisional matrix material by temporarily solidifying the matrix precursor which make up the first matrix applying layer. In other words, the provisional matrix material is formed by temporarily solidifying the matrix precursor. As a result, the second matrix applying layer is formed by the first matrix applying layer. In the present embodiment, the second matrix applying layer (second resin layer 417b) including the fillers 160 and the provisional matrix material (resin 162) is formed by temporarily solidifying the matrix precursor (resin precursor 161) which make up the first matrix applying layer (first resin layer 417a). In other words, the resin 162 is formed by temporarily solidifying the resin precursor 161. As a result, the second resin layer 417b is formed by the first resin layer 417a.

The step (d) includes immersing, for a specific period of time, at least the second matrix applying layer (second resin layer 417b) in the liquid 130 having characteristics which cause the provisional matrix material (resin 162) to be dissolved, thereby removing the second matrix applying layer (second resin layer 417b) at least in the area formed over the column-shaped section 110.

The step (e) includes forming the insulating layer 417 which includes the fillers 160 and covers the side surface of the column-shaped section 110 by curing the provisional matrix material (resin 163 in FIG. 27) which makes up the second matrix applying layer (second resin layer 417c).

The step (a) is described below.

Figure 21:
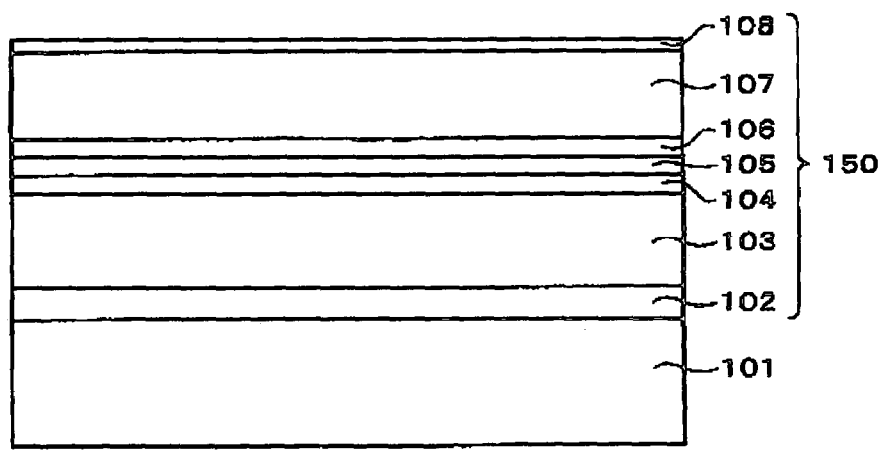
FIG. 21 is a cross-sectional view schematically showing a fabrication step of the surface-emitting semiconductor laser shown in FIG. 20.

The semiconductor multilayer film 150 shown in FIG. 21 is epitaxially grown on the surface of the n-type GaAs semiconductor substrate 101 shown in FIG. 21 while changing the composition. The semiconductor multilayer film 150 includes the buffer layer 102 formed of n-type GaAs, the lower mirror 103 in which n-type AlAs layers and n-type $Al_{0.15}Ga_{0.85}As$ layers are applied alternately, the n-type cladding layer 104 formed of n-type $Al_{0.5}Ga_{0.5}As$, the active layer 105 formed of GaAs well layers and $Al_{0.3}Ga_{0.7}As$ barrier layers having a multiple quantum well structure in which the well layers are formed of three layers, the p-type cladding layer 106 formed of $Al_{0.5}Ga_{0.5}As$, the upper mirror 107 in which p-type $Al_{0.85}Ga_{0.15}As$ layers and p-type $Al_{0.15}Ga_{0.85}As$ layers are applied alternately, and the contact layer 108 formed of p-type GaAs. The semiconductor multilayer film 150 is formed by depositing these layers on the semiconductor substrate 101 in that order.

The epitaxial growth temperature is appropriately determined according to the type of the semiconductor substrate 101 or the type or thickness of the semiconductor multilayer film 150. The epitaxial growth temperature is preferably 600 to 800° C. The period of time needed for the epitaxial growth is also appropriately determined. As the epitaxial growth method, an MOVPE (Metal-Organic Vapor Phase Epitaxy) method, MBE (Molecular Beam Epitaxy) method, or LPE (Liquid Phase Epitaxy) method may be used.

A photoresist (not shown) is applied to the contact layer 108 and then patterned using photolithography, thereby forming a resist layer (not shown) with a specific pattern. The contact layer 108, upper mirror 107, p-type cladding layer 106, active layer 105, n-type cladding layer 104, and part of the lower mirror 103 are dry-etched using the resist layer as a mask, thereby forming the column-shaped section 110 which is a column-shaped semiconductor deposition, as shown in FIGS. 22 and 23. The resonator 120 including the column-shaped section 110 is formed on the semiconductor substrate 101 by this step, as shown in FIG. 22.

The step (b) is described below.

In this step, the column-shaped section 110 is covered with the first resin layer 417a including the fillers 160 and the resin precursor 161.

Figure 24:
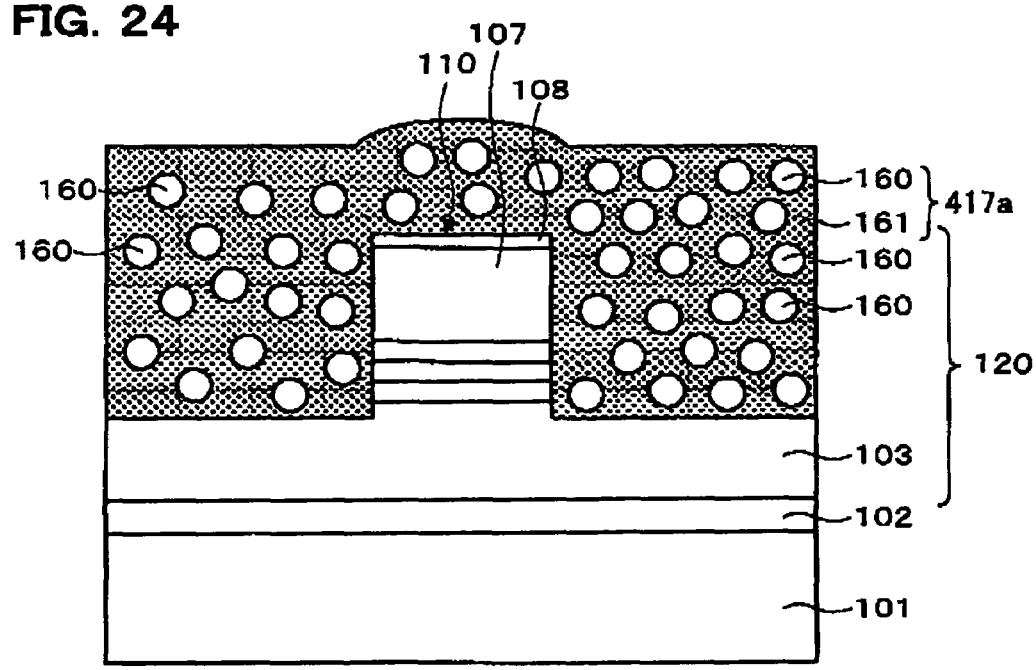
FIG. 24 is a cross-sectional view schematically showing another fabrication step of the surface-emitting semiconductor laser shown in FIG. 20.

A liquid substance containing the fillers 160 and the resin precursor 161 (not shown) is applied to the column-shaped section 110 and the upper mirror 103 and then dried, thereby forming the first resin layer 417a to cover the column-shaped section 110, as shown in FIG. 24. In this step, the first resin layer 417a is formed so that the thickness of the first resin layer 417a is at least greater than the height of the column-shaped section 110, and the column-shaped section 110 is covered with the first resin layer 417a. As the fillers 160 and resin precursor 161, those formed of the materials illustrated in the description relating to the structure of the device are used. The resin precursor 161 is applied after dissolving in a solvent, as required. In this case, the solvent is evaporated after the resin precursor is applied.

As a method of applying the liquid substance, a conventional technique such as a spin coating process, dipping process, or spray coating process may be used. During the application of the liquid substance, it is preferable to prevent unevenness of the film thickness caused by a convex section formed by the column-shaped section 110 as far as possible.

The step (c) is described below.

Figure 25:
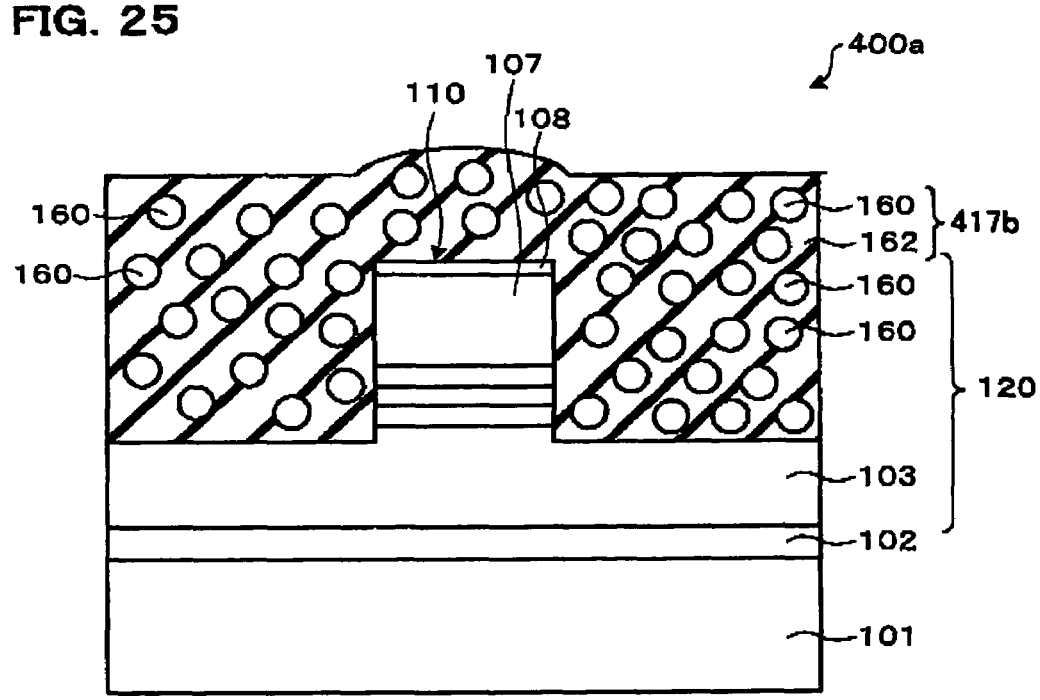
FIG. 25 is a cross-sectional view schematically showing another fabrication step of the surface-emitting semiconductor laser shown in FIG. 20.

In this step, the resin precursor 161 in the first resin layer 417a is temporarily solidified by applying energy such as heat or light to the resin precursor 161, thereby forming the second resin layer 417b, as shown in FIG. 25. For example, the resin precursor 161 is converted into the resin 162 shown in FIG. 25 by reacting at least a part of the resin precursor 161 shown in FIG. 24 by irradiation with energy such as heat or light. The resin 162 obtained by this step has a lower solubility in the liquid 130 described later (see FIG. 26) than the resin precursor 161. The dose of energy is set so that the resin precursor 161 is not completely cured and the fillers 160 are scarcely affected. The second resin layer 417b including the fillers 160 and the resin 162 is obtained by this step, as shown in FIG. 25.

This temporarily solidifying step is performed while controlling the period of time for applying energy and the dose of the energy depending on the type or concentration of the resin precursor 161 included in the first resin layer 417a. In the case of temporarily solidifying the resin precursor 161 using heat, the reaction temperature is controlled. In the case of temporarily solidifying the resin precursor 161 using light, the amount of light is controlled. In the case of forming the resin 162 (see FIG. 25) having a lower solubility in the liquid 130 than the resin precursor 161 by temporarily solidifying at least a part of the resin precursor 161 included in the first resin layer 417a using heat, the resin precursor 161 is temporarily solidified at a lower temperature for a shorter period than those employed in a heat curing step for forming an insulating layer by completely curing the resin precursor 161. If the dose of the energy applied is insufficient, the solubility in the liquid 130 is not changed since the resin precursor 161 is not fully reacted, whereby the resulting resin is dissolved in the liquid 130 and removed. If the dose of the energy is too great, the solubility in the liquid 130 is decreased too much since a large amount of the resin precursor 161 is reacted, whereby the resulting resin is not dissolved in the liquid 130 and removal of the resin becomes difficult. Therefore, it is important to control the period of time and the dose of energy to be applied during temporal solidification depending on the type and density of the resin precursor.

As the resin precursor used in this step, a polyimide precursor is preferably used. The polyimide precursor has a low viscosity and significantly shrinks in volume during curing.

As examples of the polyimide precursor, polyamic acid, long-chain alkyl ester of polyamic acid, and the like can be given. In the case of forming the insulating layer from the polyimide precursor, when the polyimide precursor is applied and then heated, an imidization reaction occurs. As a result, a polyimide resin is produced, whereby the insulating layer is formed. The heating temperature applied when forming the insulating layer is 150 to 400° C., and preferably 300 to 400° C., although the temperature is changed depending on type of the polyimide precursor.

In the case of using a resin cured by irradiation with light as the resin for forming the insulating layer 417 (see FIG. 20), a UV-curable polyacrylic resin or epoxy resin may be used. Since the UV-curable resin can be cured only by irradiation with ultraviolet rays, problems such as changes in the device characteristics due to heat can be avoided.

The step (d) is described below.

Figure 26:
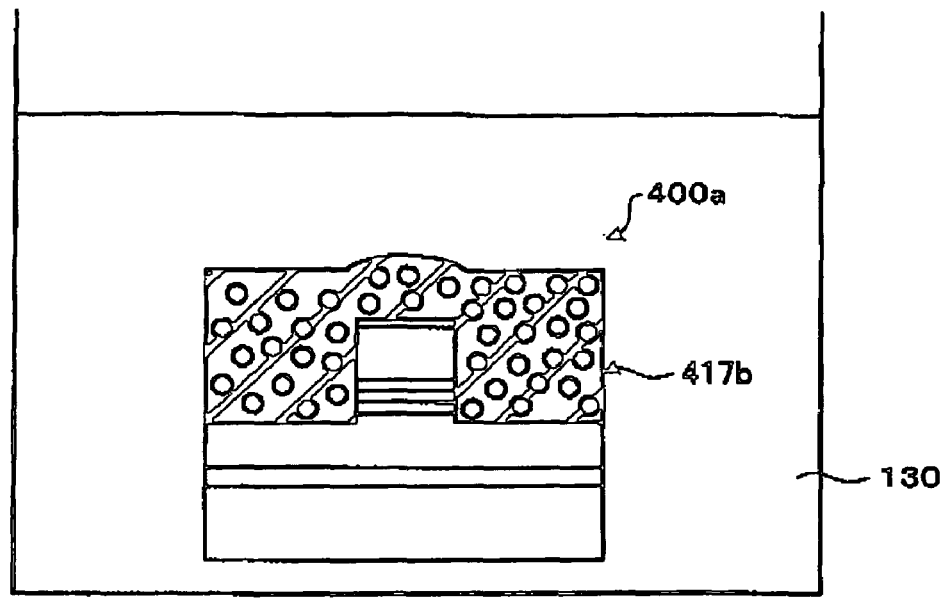
FIG. 26 is a cross-sectional view schematically showing another fabrication step of the surface-emitting semiconductor laser shown in FIG. 20.

In this step, a device 400a obtained by the steps (a) to (c) is immersed in the liquid 130 for a specific period of time, as shown in FIG. 26. FIG. 26 illustrates a case where the entire area of the device 400a is immersed in the liquid 130. However, it suffices that at least the second resin layer 417b of the device 400a be immersed.

The liquid 130 has characteristics which cause the second resin layer 417b to be dissolved. The liquid 130 may be appropriately selected depending on the type of resin precursor. In the case where the resin precursor is a polyimide precursor, an alkaline solution may be used as the liquid 130.

In this step, the solubility of the column-shaped section 110 in the liquid 130 may be lower than the solubility of the resin 162 in the liquid 130. This enables a sufficient margin to be produced relating to the period of time in which the column-shaped section 110 and the second resin layer 417b are immersed in the liquid 130, thereby enabling stable fabrication. Moreover, since the column-shaped section 110 can be prevented from being dissolved in the liquid 130 before the resin 162, effects on the characteristics of the device can be limited.

The solubility of the fillers 160 in the liquid 130 may be lower than the solubility of the resin 162 in the liquid 130. This enables the fillers 160 to be prevented from being dissolved in the liquid 130 before the resin 162 which makes up the second resin layer 417b. As a result, a specific amount of the fillers 160 can be included in the resulting insulating layer 417.

Figure 27:
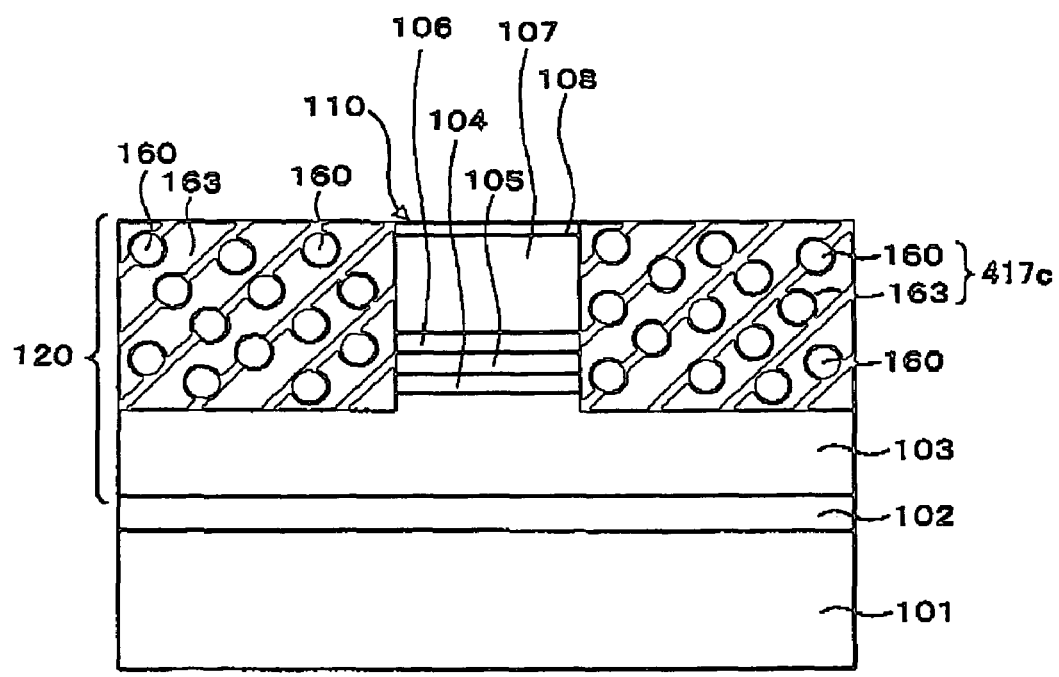
FIG. 27 is a cross-sectional view schematically showing yet another fabrication step of the surface-emitting semiconductor laser shown in FIG. 20.

In this step, the second insulating layer 417c including the fillers 160 and the resin 163 is obtained by controlling the period of time and temperature for immersion in the liquid 130, as shown in FIG. 27. The second insulating layer 417c is the second resin layer 417b shown in FIG. 26 of which the area formed over the column-shaped section 110 is removed, as shown in FIG. 27. In this step, the second resin layer 417b formed on the lower mirror 103 is also dissolved in the liquid 130. As a result, the second insulating layer 417c can be formed so that the upper surface of the second insulating layer 417c is almost level with the upper surface of the column-shaped section 110, as shown in FIG. 27. In this step, the fillers 160 present in upper part of the second resin layer 417b are removed as the second resin layer 417b is removed.

The step (e) is described below.

In this step, the insulating layer 417 which covers the side surface of the column-shaped section 110 is formed by curing the second resin layer 417c shown in FIG. 27. The second resin layer 417c is cured at a temperature for a period of time referring to the temperature and period of time in a conventional step of curing a resin during formation of an insulating layer. The insulating layer 417 which covers the side surface of the column-shaped section 110 is formed by this step, as shown in FIG. 20.

The step of forming the electrodes 113 and 115 for injecting current into the active layer 10S is described below.

Before forming the electrodes 113 and 115, the upper surface of the column-shaped section 110 is optionally cleaned using a dry etching method or the like. This enables formation of a device having more stable characteristics. A metal film (not shown) is formed on the upper surfaces of the insulating layer 417 and the column-shaped section 110 using a vacuum deposition process and then annealed, thereby forming an alloy layer (not shown) formed of gold, zinc, or the like. The opening 116 is formed by patterning the alloy layer using a photolithography. The annealing temperature is usually at about 400° C. The upper electrode 113 is formed by this step. A metal film (not shown) is formed on the back surface of the semiconductor substrate 101 using a vacuum deposition process and then annealed, thereby forming the lower electrode 115 of an alloy layer formed of gold and germanium, for example. The surface-emitting laser 400 shown in FIG. 20 is obtained by the above process.

Action and Effects

The surface-emitting semiconductor laser 400 of the present embodiment has the following major action and effects. Before describing these action and effects, the structure and operation of a commonly-used surface-emitting semiconductor laser are briefly described below.

(1) Structure and Operation of Commonly-Used Surface-Emitting Semiconductor Laser The surface-emitting semiconductor laser is a two-dimensionally integratable light-emitting device. Therefore, application of the surface-emitting semiconductor laser to parallel optical communications, parallel optical arithmetic, and the like as a high-speed, large-capacity light source in the next generation has been expected. The surface-emitting semiconductor laser emits a laser beam from a resonator formed on a semiconductor substrate in the direction perpendicular to the surface of the semiconductor substrate on which the resonator is formed. The resonator functions as a laser oscillator, which is formed by applying a reflection layer, an active layer, and a reflection layer in that order.

Current must be injected into the active layer from the surface of the laser in order to drive the surface-emitting semiconductor laser. Therefore, a pair of electrodes for injecting current into the active layer is formed in the laser. In order to concentrate the current on the active layer, a method of forming a section of the resonator including at least the active layer in the shape of a column using etching is generally employed.

(2) Heat is generated in the resonator when driving the surface-emitting semiconductor laser. This heat increases the temperature near the resonator, whereby the characteristics of the device, in particular, light emission efficiency and maximum output may be decreased. In order to maintain the characteristics of the device by preventing an increase in the temperature of the device at the time of driving, it is preferable to cause the heat generated to be efficiently released to the outside.

In order to insulate the pair of electrodes for injecting current into the active layer, a method of burying the section formed in the shape of a column (column-shaped section) in an insulating resin represented by a polyimide is generally employed. However, thermal conductivity of an insulating layer formed of the insulating resin is generally low. Therefore, if such an insulating layer is formed so that the column-shaped section is buried in the insulating layer, heat generated at the time of driving may not be released to the outside efficiently, whereby stable characteristics of the device may not be obtained.

On the contrary, according to the surface-emitting laser 400 of the present embodiment, the insulating layer 417 includes the fillers 160. The insulating layer 417 is formed using the fillers 160 having a specific thermal conductivity and coefficient of thermal expansion corresponding to the thermal conductivity of the semiconductor substrate 101 and the coefficient of thermal expansion of the resin 163 which makes up the insulating layer 417. This enables the characteristics of the insulating layer 417 such as thermal conductivity and coefficient of thermal expansion to be adjusted. Therefore, strain occurring between the semiconductor substrate 101 and the insulating layer 417 can be decreased, thereby excellent heat release and good device characteristics can be obtained.

(3) A commonly-used surface-emitting laser is formed by using a GaAs substrate as the semiconductor substrate and a polyimide resin as the insulating layer which covers the column-shaped section. In the surface-emitting laser 400 of the present embodiment, in the case of using a GaAs substrate as the semiconductor substrate 101 and a polyimide resin as the resin 163, the insulating layer 417 is formed by curing the resin precursor at about 400° C. (see fabrication process described later). Heat-curable or photo-curable resins such as a polyimide resin generally have a coefficient of thermal expansion greater than that of the GaAs substrate which forms the semiconductor substrate 101. Therefore, when the device is cooled to room temperature after forming the insulating layer 417, a large amount of strain occurs between the semiconductor substrate 101 and the insulating layer 417 due to the difference in coefficient of thermal expansion between the semiconductor substrate 101 and the insulating layer 417. This strain may cause the semiconductor substrate 101 to be warped or reliability of the device to be impaired.

On the contrary, in the surface-emitting laser 400 of the present embodiment, the fillers 160 included in the insulating layer 417 have a function of adjusting the difference in coefficient of thermal expansion between the semiconductor substrate 101 and the insulating layer 417, whereby the amount of strain can be decreased. In the case of using a GaAs substrate as the semiconductor substrate 101 and a polyimide resin as the resin 163 as described above, the polyimide resin has a coefficient of thermal expansion greater than that of the GaAs substrate. Therefore, the difference in coefficient of thermal expansion between the semiconductor substrate 101 and the insulating layer 417 can be decreased by allowing the fillers 160 formed of a material having a coefficient of thermal expansion smaller than that of the polyimide resin to be present in the insulating layer 417. As a result, the amount of strain occurring between the semiconductor substrate 101 and the insulating layer 417 can be decreased, whereby the reliability of the device can be maintained. As examples of the material having a coefficient of thermal expansion smaller than that of the polyimide resin, diamond and silicon can be given.

Specifically, the difference in coefficient of thermal expansion between the semiconductor substrate 101 and the insulating layer 417 can be decreased by allowing the insulating layer 417 to include the fillers 160 having a specific coefficient of thermal expansion corresponding to the difference in coefficient of thermal expansion between the semiconductor substrate 101 and the insulating layer 417. As a result, the amount of strain occurring between the semiconductor substrate 101 and the insulating layer 417 can be decreased.

(4) According to the method of fabricating the surface-emitting laser 400 of the present embodiment, effects and advantages the same as those in the case of using the method of fabricating the surface-emission type light-emitting device of the first embodiment can be obtained. Specifically, according to the method of fabricating the surface-emitting laser 400 of the present embodiment, only the second matrix applying layer (second resin layer 417b) in the area over the column-shaped section 110 can be removed without causing damage to the column-shaped section 110 in the step (d) by immersing at least the second matrix applying layer (second resin layer 417b) in the liquid 130 for a specific period of time and removing the second matrix applying layer (second resin layer 417b) in the area formed over the column-shaped section 110. This enables the device 400 having stable characteristics to be obtained. Moreover, the device 400 can be fabricated at a lower cost and at high yields.

In the step (c), the provisional matrix material (resin 162) having a lower solubility in the liquid 130 than the matrix precursor (resin precursor 161) is formed by temporarily solidifying the matrix precursor (resin precursor 161) which forms the first matrix applying layer (first resin layer 417a). Since the dissolving rate of the provisional matrix material (resin 162) in the liquid 130 is lower than the dissolving rate of the matrix precursor (resin precursor 161) in the liquid 130, a margin during the removal step of the second matrix applying layer (second resin layer 417b) in the liquid 130 can be increased by this temporal solidification step.

Moreover, since the greater part of the removed provisional matrix material (resin 162) is dissolved in the liquid 130, the device characteristics scarcely deteriorate due to the provisional matrix material (resin 162) readhering to the device after the removal.

(5) In the fabrication of the surface-emitting laser 400 shown in FIG. 20, in the case of forming the insulating layer using a commonly-used formation step of an insulating layer, an insulating layer having the same thickness as the insulating layer 417 is formed by applying an insulating layer (not shown) to cover the column-shaped section 110, and removing the insulating layer by etching so that the upper surface of the column-shaped section 110 is exposed. In this case, the fillers 160 included in the insulating layer hinder etching during the etching step, whereby it may become difficult to form the insulating layer at a uniform thickness.

On the contrary, according to the method of fabricating the surface-emitting laser 400 of the present embodiment, the fillers 160 present in the upper part of the second matrix applying layer (second resin layer 417b) are automatically removed from the second matrix applying layer (second resin layer 417b) as the second matrix applying layer (second resin layer 417b) is removed from the upper surface of the surface-emitting laser 400 in the step (d). This enables the insulating layer 417 including the fillers 160 to be formed at a uniform thickness by a step almost the same as a commonly-used formation step for an insulating layer.

The above embodiment illustrates the case of a surface-emitting semiconductor laser having one column-shaped section. However, the present invention is not impaired even if a plurality of column-shaped sections is formed on the substrate.

The above embodiment illustrates the surface-emitting semiconductor laser. However, the present invention is applicable to semiconductor devices other than the surface-emitting semiconductor laser. As examples of semiconductor devices to which the present invention can be applied, EL devices, LED devices, ICs, piezo devices, and the like can be given. In the case of applying the present invention to ICs, the insulating layer including fillers according to the present invention can be applied to an interlayer dielectric.

Fifth Embodiment

Figure 28:
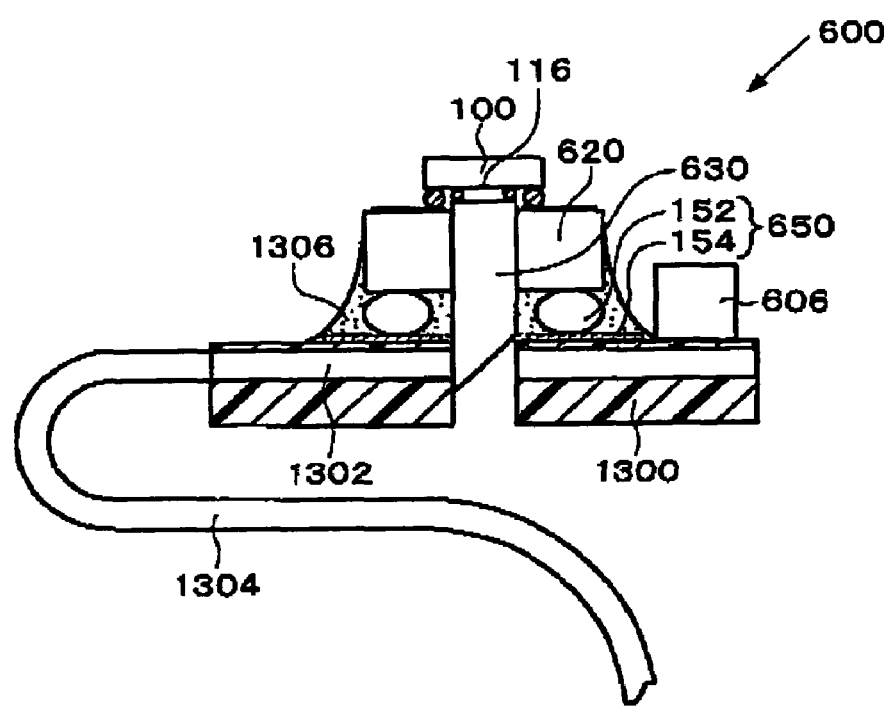
FIG. 28 is a view illustrating a method of fabricating an optical module according to a fifth embodiment to which the present invention is applied.

FIG. 28 is a view illustrating an optical module according to a fifth embodiment to which the present invention is applied, and a method of fabricating the optical module. The optical module according to the present embodiment includes a structure 600 (see FIG. 28). The structure 600 includes the surface-emission type light-emitting device 100 of the first embodiment (see FIG. 1), a platform 620, a first optical waveguide 630, and an actuator 650. The structure 600 also includes a second optical waveguide 1302. The second optical waveguide 1302 forms part of a substrate 1300. A connection optical waveguide 1304 may be optically connected with the second optical waveguide 1302. The connection optical waveguide 1304 may be an optical fiber.

In the optical module of the present embodiment, light is emitted from the surface-emission type light-emitting device 100 (light exit port 116, see FIG. 1), and received by a photodetector (not shown) through the first and second optical waveguides 630 and 1302 (and the connection optical waveguide 304).

Sixth Embodiment

Figure 29:
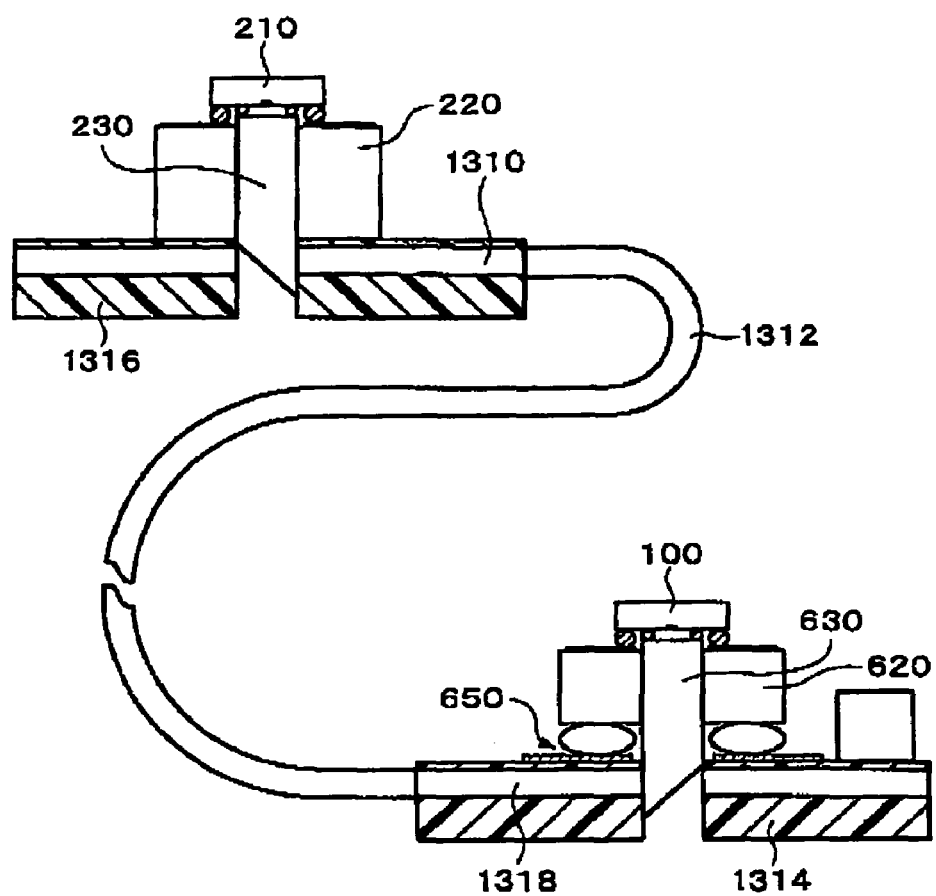
FIG. 29 is a view showing an optical transmission device according to a sixth embodiment to which the present invention is applied.

FIG. 29 is a view illustrating an optical transmission device according to a sixth embodiment to which the present invention is applied. In the present embodiment, a plurality of third optical waveguides 230, 1310, and 1312 is provided between the first optical waveguide 630 and a photodetector 210. The optical transmission device according to the present embodiment includes a plurality (two) of substrates 1314 and 1316.

In the present embodiment, the third optical waveguide 1312 is disposed between the structure including the surface-emission type light-emitting device 100 (including the surface-emission type light-emitting device 100, platform 620, first optical waveguide 630, second optical waveguide 1318, and actuator 650) and the structure including the photodetector 210 (including the photodetector 210, platform 220, and third optical waveguides 230 and 1310). Optical transmission between a plurality of pieces of electronic equipment can be performed using an optical fiber or the like as the third optical waveguide 1312.

Figure 30:
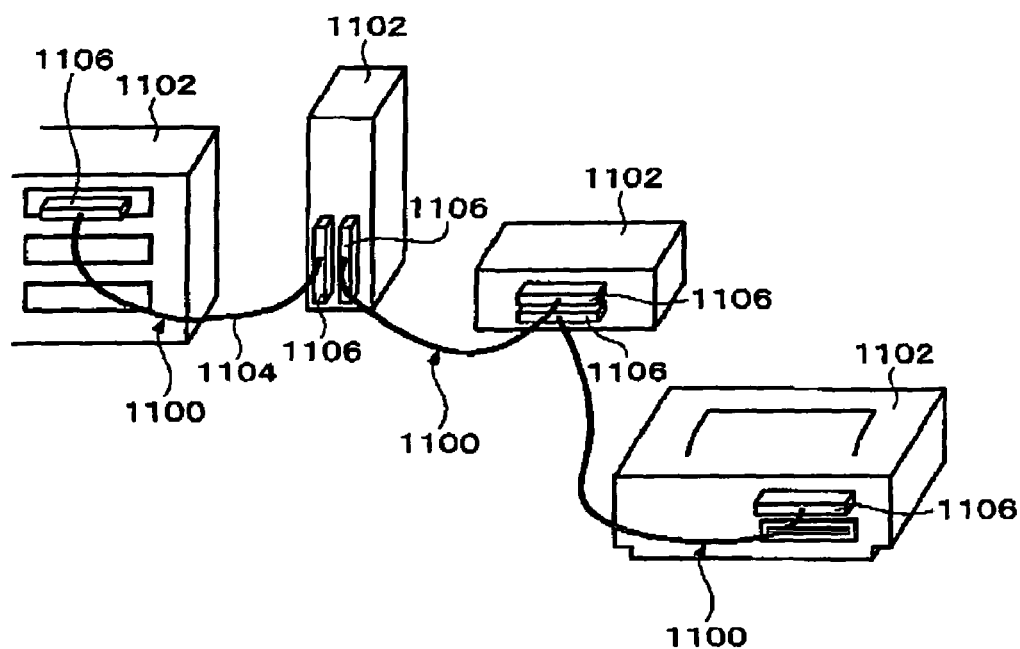
FIG. 30 is a view showing the optical transmission device according to the sixth embodiment to which the present invention is applied.

In FIG. 30, an optical transmission device 1100 interconnects with each piece of electronic equipment 1102 such as computers, displays, storage devices, and printers. The electronic equipment 1102 may be information communications equipment. The optical transmission device 1100 includes a cable 1104 including the third optical waveguide 1312 such as an optical fiber. The optical transmission device 1100 may be one in which plugs 1106 are provided on both ends of the cable 1104. The structure including either light emitting device 100 or photodetector 200 is provided in each of the plugs 1106. Electrical signals output from one piece of electronic equipment 1102 are converted into optical signals by the light-emitting device. The optical signals are transmitted through the cable 1104 and converted into electrical signals by the photodetector. The electrical signals are input to the other piece of electronic equipment 1102. According to the optical transmission device 1100 of the present embodiment, transmission of information between each piece of electronic equipment 1102 can be achieved by optical signals.

Figure 31:
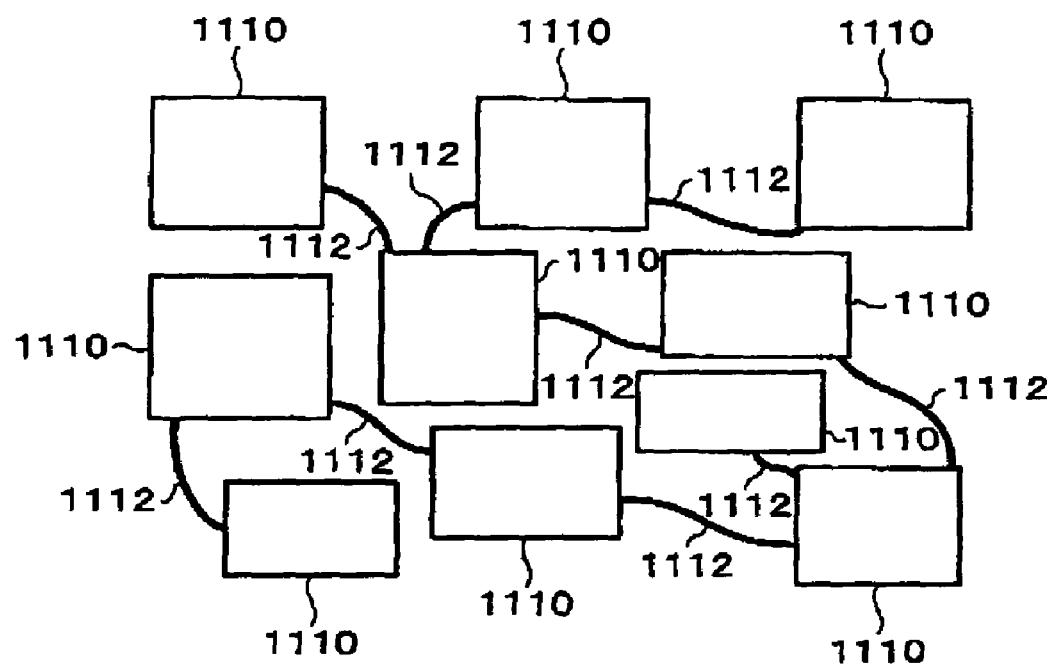
FIG. 31 is a view showing conditions of use of the optical transmission device according to the sixth embodiment to which the present invention is applied.

FIG. 31 is a view showing conditions of use of an optical transmission device according to the embodiment to which the present invention is applied. An optical transmission device 1112 interconnects each piece of electronic equipment 1110. As examples of the electronic equipment 1110, liquid crystal display monitors or digital CRTs (may be used in the field of finance, mail order, medical treatment, and education), liquid crystal projectors, plasma display panels (PDPs), digital TVs, cash registers (for Point of Sale Scanning (POS)) for retail stores, video cassette recorders, tuners, game machines, printers, and the like can be given.

In the fifth and the sixth embodiments (see FIGS. 28 to 31), the same effects and advantages can be achieved in the case of using the surface-emission type light-emitting device 200 (see FIG. 9), 300 (see FIG. 15), or 400 (see FIG. 21) instead of using the surface-emission type light-emitting device 100.

Seventh Embodiment

Figure 32:
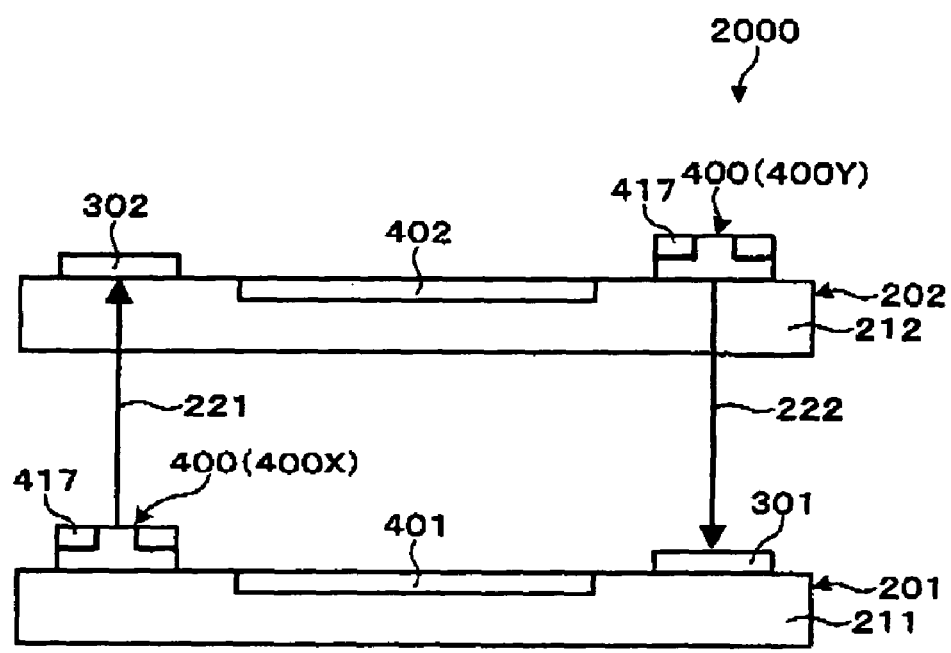
FIG. 32 is a view showing conditions of use of an optical transmission device according to a seventh embodiment to which the present invention is applied.

FIG. 32 is a view illustrating an optical transmission device according to a seventh embodiment to which the present invention is applied. The present embodiment illustrates a case where the optical transmission device functions as an optical interconnection device 2000 between IC chips as an example.

Device Structure

In the optical interconnection device 2000 of the present embodiment, a plurality of IC chips is formed in layers. The present embodiment illustrates an example in which two IC chips are layered in the optical interconnection device 2000, as shown in FIG. 32. However, the number of IC chips to be layered is not limited thereto.

In the optical interconnection device 2000, laser beams 221 and 222 are transmitted between layered IC chips 201 and 202 to execute transmission of data. The IC chips 201 and 202 respectively include substrates (silicon substrates, for example) 211 and 212, and IC regions 401 and 402 formed on the substrates 211 and 212. As examples of the IC chips 201 and 202, various types of ICs such as a CPU, memory, and ASIC can be given.

On the IC chip 201, the surface-emitting laser 400 (see fourth embodiment) and a photodetector 301 are disposed on the substrate 211. Similarly, on the IC chip 202 the surface-emitting laser 400 and a photodetector 302 are disposed on the substrate 212. The surface-emitting laser 400 formed on the IC chip 201 is referred to as 400X, and the surface-emitting laser 400 formed on the IC chip 202 is referred to as 400Y.

Device Operation

The operation of the optical interconnection device 2000 is described below with reference to FIG. 32.

In the optical interconnection device 2000, a signal which is electrically processed in the IC region 401 of the IC chip 201 is converted into a laser pulse signal by the resonator 120 (see FIG. 20; not shown in FIG. 32) of the surface-emitting laser 400X, and sent to the photodetector 302 of the IC chip 202. The photodetector 302 converts the received laser pulse into an electrical signal and sends the electrical signal to the IC region 402.

The optical interconnection device 2000 is operated in the same manner in the case of sending a laser beam from the surface-emitting laser 400Y formed on the IC chip 202 to the photodetector 301. Specifically, in the optical interconnection device 2000, a signal which is electrically processed in the IC region 402 of the IC chip 202 is converted into a laser pulse signal by the resonator 120 (see FIG. 20; not shown in FIG. 32) of the surface-emitting laser 400Y, and sent to the photodetector 301 of the IC chip 201. The photodetector 301 converts the received laser pulse signal into an electrical signal and sends the electrical signal to the IC region 401. In this way, the IC chips 201 and 202 transmit data via the laser beam.

In the case where the substrates 211 and 212 consist of silicon substrates, light emitted from the surface-emitting lasers 400 is allowed to pass through the substrates (silicon substrates) 211 and 212 by setting the oscillation wavelength of the resonators of the surface-emitting lasers 400 to 1.1 μm or more.

Accompanied by an increase in the processing speed and frequency, the following problems generally occur relating to signal transmission between electrically connected IC chips: occurrence of skew on signal transmission timing between interconnections; increase in power consumption during transmission of a high frequency electrical signal; difficulty of designing interconnection layout; necessity for impedance matching; and necessity for countermeasures to cut off earth noise.

The above problems can be solved by performing signal transmission between IC chips using an optical signal as in the optical interconnection device 2000 of the present embodiment.

In the optical interconnection device 2000 of the present embodiment, the surface-emitting lasers 400 are formed on the IC chips 201 and 202. As described in the fourth embodiment, the surface-emitting laser 400 includes the column-shaped section 110 and the insulating layer 417 which covers the side of the column-shaped section 110, wherein the insulating layer 417 includes the fillers 160 (see FIG. 20; not shown in FIG. 32). Since heat radiation characteristics of the surface-emitting laser 400 is increased by this configuration, a stable operation can be achieved.

Specifically, the present invention is not limited to the above-described embodiments, and various modifications are possible. For example, the present invention includes configurations essentially the same as the configurations described in the embodiments (for example, configurations having the same function, method, and results, or configurations having the same object and results). The present invention includes configurations in which any unessential part of the configuration described in the embodiment is replaced. The present invention includes configurations having the same effects or achieving the same object as the configurations described in the embodiments. The present invention includes configurations in which conventional technology is added to the configurations described in the embodiments.

What is claimed is:

1. A surface-emitting semiconductor laser including a resonator formed on a semiconductor substrate, which emits light in a direction perpendicular to the semiconductor substrate, comprising:
a column-shaped section which forms at least a part of the resonator, and
an insulating layer which covers a side surface of the column-shaped section,
wherein the insulating layer comprises a filler,
wherein the filler is formed of a material having a coefficient of thermal expansion that is smaller than a coefficient of thermal expansion of a matrix material which makes up the insulating layer,
wherein the filler is formed of at least one of silicon and carbon allotropes including carbon, graphite, and diamond.

2. The surface-emitting semiconductor laser as defined in claim 1,
wherein the thermal conductivity of the filler is higher than that of the matrix material which forms the insulating layer.

3. The surface-emitting semiconductor laser as defined in claim 1,
wherein the matrix material which makes up the insulating layer is a polyimide resin.

4. The surface-emitting semiconductor laser as defined in claim 1,
wherein the filler is a particle, and the diameter of the particle is smaller than the thickness of the insulating layer.

5. A surface-emitting semiconductor laser including a resonator formed on a semiconductor substrate, which emits light in a direction perpendicular to the semiconductor substrate, comprising:
a column-shaped section which forms at least a part of the resonator, and
an insulating layer which covers a side surface of the column-shaped section,
wherein the insulating layer comprises a filler,
wherein the filler is formed of a material having a coefficient of thermal expansion being smaller than a coefficient of thermal expansion of a matrix material which makes up the insulating layer,
wherein the filler is a metal particle having an insulating film on a surface.

6. The surface-emitting semiconductor laser as defined in claim 5,
wherein the thermal conductivity of the filler is higher than that of a matrix material which forms the insulative layer.

7. The surface-emitting semiconductor laser as defined in claim 5,
wherein the matrix material which makes up the insulating layer is a polyimide resin.

8. The surface-emitting semiconductor laser as defined in claim 5,
wherein the particle diameter of the filler is smaller than the thickness of the insulating layer.

9. The surface-emitting semiconductor laser as defined in claim 5,
wherein the metal particle includes at least one of aluminum, gold, silver, copper, tin, magnesium, nickel, and zinc as an essential component.

* * * * *